United States Patent
Huang

(10) Patent No.: US 11,824,082 B2
(45) Date of Patent: Nov. 21, 2023

(54) METHOD FOR FABRICATING SEMICONDUCTOR DEVICE WITH CAPACITORS HAVING SHARED ELECTRODE

(71) Applicant: NANYA TECHNOLOGY CORPORATION, New Taipei (TW)

(72) Inventor: Chih-Wei Huang, Taoyuan (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 83 days.

(21) Appl. No.: 17/732,742

(22) Filed: Apr. 29, 2022

(65) Prior Publication Data

US 2022/0262894 A1 Aug. 18, 2022

Related U.S. Application Data

(62) Division of application No. 17/119,771, filed on Dec. 11, 2020, now Pat. No. 11,605,703.

(51) Int. Cl.
*H01G 4/008* (2006.01)
*H01L 23/522* (2006.01)
*H01L 49/02* (2006.01)

(52) U.S. Cl.
CPC .............. *H01L 28/75* (2013.01); *H01G 4/008* (2013.01); *H01L 23/5222* (2013.01)

(58) Field of Classification Search
CPC .................. H01L 28/75; H01L 23/5222; H01L 21/76816; H01L 21/7685; H01L 21/76879; H01G 4/008
See application file for complete search history.

(56) References Cited

U.S. PATENT DOCUMENTS

2016/0020267 A1  1/2016  Lin
2021/0005393 A1* 1/2021  Lu ..................... H01L 29/66181

FOREIGN PATENT DOCUMENTS

TW           201834203 A      9/2018

OTHER PUBLICATIONS

Office Action and Search Report dated Apr. 21, 2023 related to Taiwanese Application No. 110128081.
Office Action dated Aug. 5, 2022 related to U.S. Appl. No. 17/119,771 wherein this application is a DIV of U.S. Appl. No. 17/119,771.

* cited by examiner

*Primary Examiner* — Thanhha S Pham
(74) *Attorney, Agent, or Firm* — Xuan Zhang

(57) ABSTRACT

The present application discloses a method for fabricating a semiconductor device with capacitors having a shared electrode. The method includes providing a substrate, forming a first trench in the substrate, doping sidewalls and a bottom surface of the first trench to form a bottom conductive structure, forming a first insulating layer on the bottom conductive structure and in the first trench, forming a shared conductive layer on the first insulating layer, forming a second insulating layer on the shared conductive layer, forming a top conductive layer on the second insulating layer, and forming a connection structure electrically connecting the bottom conductive structure and the top conductive layer. The bottom conductive structure, the first insulating layer, and the shared conductive layer together configure a first capacitor unit. The shared conductive layer, the second insulating layer, and the top conductive layer together configure a second capacitor unit.

16 Claims, 33 Drawing Sheets

METHOD FOR FABRICATING SEMICONDUCTOR DEVICE WITH CAPACITORS HAVING SHARED ELECTRODE

CROSS-REFERENCE TO RELATED APPLICATION

This application is a divisional application of U.S. Non-Provisional application Ser. No. 17/119,771 filed Dec. 11, 2020, which is incorporated herein by reference in its entirety.

TECHNICAL FIELD

The present disclosure relates to a method for fabricating a semiconductor device, and more particularly, to a method for fabricating a semiconductor device with capacitors having a shared electrode.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a substrate, a first capacitor unit, a second capacitor unit, and a connection structure. The first capacitor unit includes a bottom conductive structure inwardly positioned in the substrate, and a shared conductive layer positioned above the bottom conductive structure with a first insulating layer interposed therebetween. The second capacitor unit includes the shared conductive layer, a top conductive layer positioned above the shared conductive layer with a second insulating layer interposed therebetween. The connection structure electrically connects the bottom conductive structure and the top conductive layer such that the first capacitor unit and the second capacitor unit are in parallel.

In some embodiments, a width of the second insulating layer is greater than a width of the shared conductive layer.

In some embodiments, the semiconductor device includes first spacers positioned on sidewalls of the shared conductive layer.

In some embodiments, the connection structure including a first conductive via electrically connecting the top conductive layer, a second conductive via electrically connecting the bottom conductive structure, and a conductive line horizontally positioned on the first conductive via and the second conductive via and electrically connect the first conductive via and the second conductive via.

In some embodiments, the semiconductor device includes an assistant conductive layer positioned between the second conductive via and the bottom conductive structure. The assistant conductive layer is formed of titanium silicide, nickel silicide, nickel platinum silicide, tantalum silicide, or cobalt silicide.

In some embodiments, a thickness of the assistant conductive layer is between about 2 nm and about 20 nm.

In some embodiments, the first insulating layer is an oxide-nitride-oxide structure.

In some embodiments, the first insulating layer is formed of an insulating material having a dielectric constant of about 4.0 or greater.

In some embodiments, the semiconductor device includes an interfacial layer positioned between the bottom conductive structure and the first insulating layer. The interfacial layer is formed of silicon oxide.

In some embodiments, a thickness of the interfacial layer is between about 7 angstroms and about 12 angstroms.

In some embodiments, the semiconductor device includes a first barrier layer positioned between the first insulating layer and the shared conductive layer. The first barrier layer is formed of titanium, titanium nitride, titanium silicon nitride, tantalum, tantalum nitride, tantalum silicon nitride, or a combination thereof.

In some embodiments, a thickness of the first barrier layer is between about 10 angstroms and about 15 angstroms.

In some embodiments, a thickness of the first insulating layer is about 10 angstroms and about 1000 angstroms.

In some embodiments, a width of the top conductive layer is less than the width of the shared conductive layer.

In some embodiments, the shared conductive layer includes a connection portion positioned above a top surface of the substrate and a bottom portion extending downwardly to the substrate.

Another aspect of the present disclosure provides a method for fabricating a semiconductor device including providing a substrate, forming a first trench in the substrate, doping sidewalls and a bottom surface of the first trench to form a bottom conductive structure, forming a first insulating layer on the bottom conductive structure and in the first trench, forming a shared conductive layer on the first insulating layer, forming a second insulating layer on the shared conductive layer, forming a top conductive layer on the second insulating layer, and forming a connection structure electrically connecting the bottom conductive structure and the top conductive layer. The bottom conductive structure, the first insulating layer, and the shared conductive layer together configure a first capacitor unit. The shared conductive layer, the second insulating layer, and the top conductive layer together configure a second capacitor unit.

In some embodiments, the substrate and the bottom conductive structure have opposite electrical type.

In some embodiments, an aspect ratio of the first trench is between about 1:6 and about 1:20.

In some embodiments, the first insulating layer is formed of an insulating material having a dielectric constant of about 4.0 or greater.

In some embodiments, the method for fabricating the semiconductor device includes a step of forming first spacers on sidewalls of the shared conductive layer before the step of forming the second insulating layer on the shared conductive layer.

Due to the design of the semiconductor device of the present disclosure, the capacitance density may be increased by the stacked and electrically paralleled coupled first capacitor unit and second capacitor unit. Accordingly, the effective capacitance of the semiconductor device may be increased such that the performance of the semiconductor device may be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
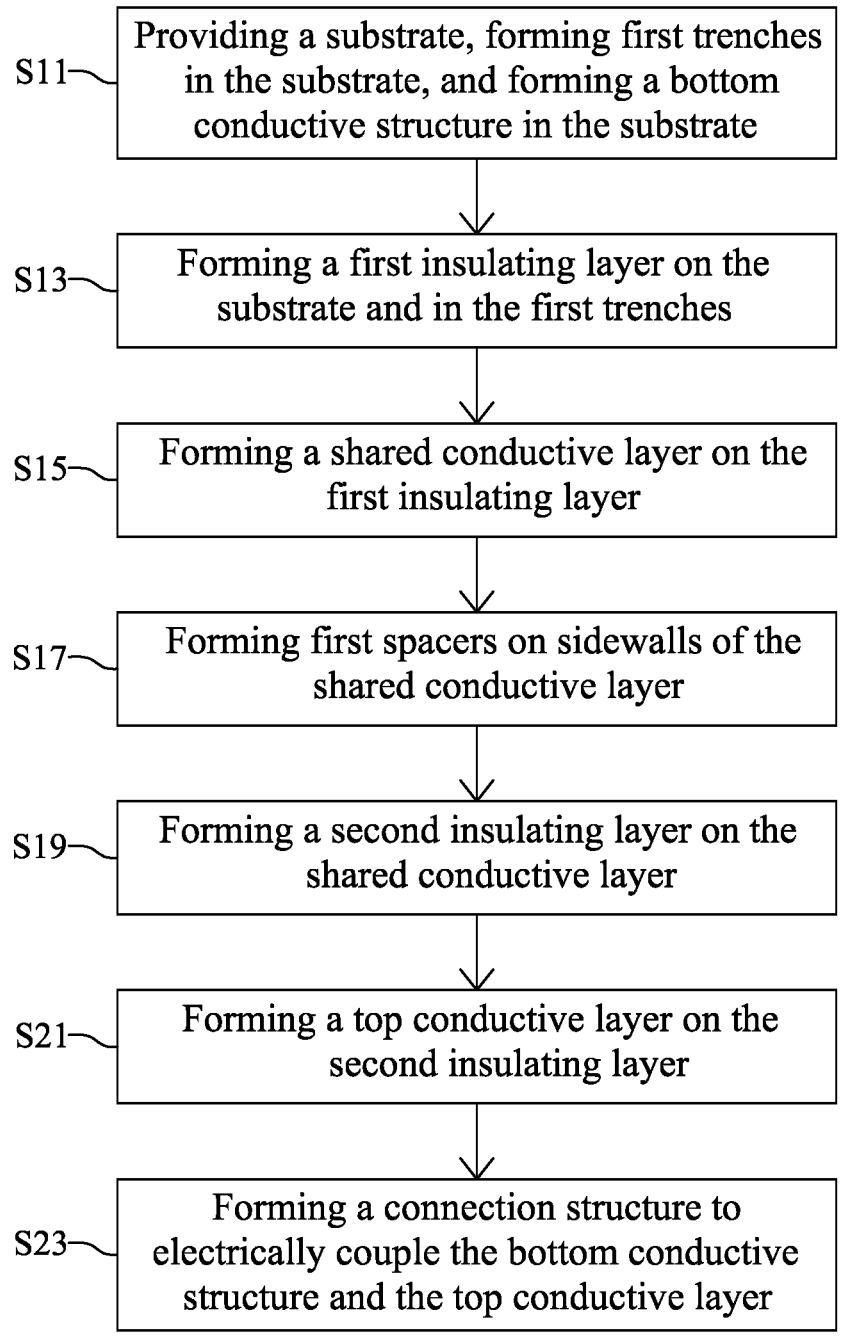
FIG. 1 illustrates, in a flowchart diagram form, a method for fabricating a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

FIG. 1 illustrates, in a flowchart diagram form, a method 10 for fabricating a semiconductor device 1A in accordance with one embodiment of the present disclosure. FIGS. 2 to 12 illustrate, in schematic cross-sectional view diagrams, a flow for fabricating the semiconductor device 1A in accordance with one embodiment of the present disclosure. FIG. 13 illustrates, in a schematic circuit diagram, the semiconductor device 1A in accordance with one embodiment of the present disclosure.

With reference to FIGS. 1 to 4, at step S11, a substrate 101 may be provided, first trenches 701 may be formed in the substrate 101, and a bottom conductive structure 200 may be formed in the substrate 101.

Figure 2:
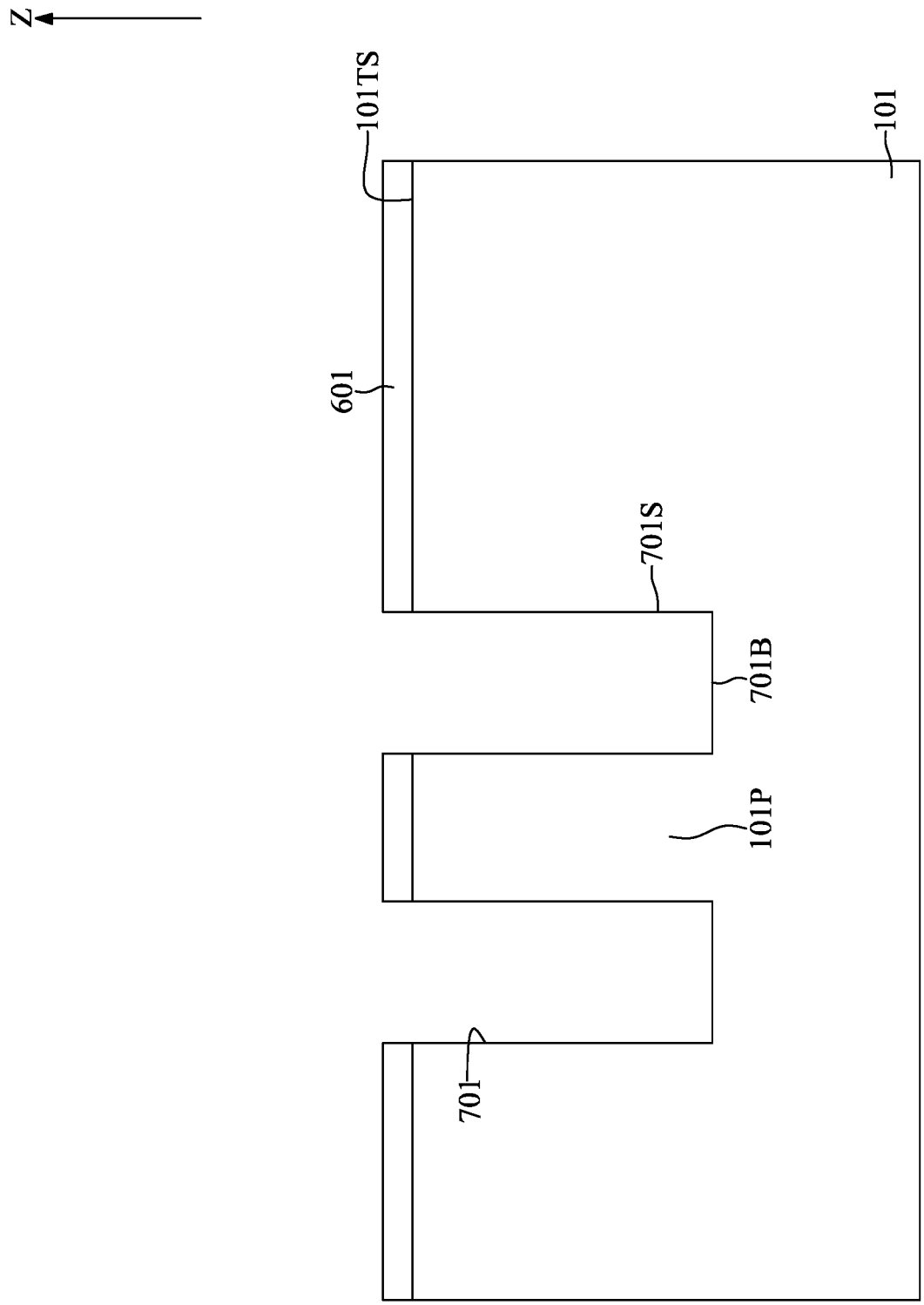
FIGS. 2 to 12 illustrate, in schematic cross-sectional view diagrams, a flow for fabricating the semiconductor device in accordance with one embodiment of the present disclosure.

With reference to FIG. 2, the substrate 101 may be a bulk semiconductor substrate. The bulk semiconductor substrate may be formed of, for example, an elementary semiconductor such as silicon or germanium or a compound semiconductor such as silicon germanium, silicon carbide, gallium arsenide, gallium phosphide, indium phosphide, indium arsenide, indium antimonide, or other III-V compound semiconductor or II-VI compound semiconductor.

In some embodiments, the substrate 101 may include a semiconductor-on-insulator structure which is consisted of, from bottom to top, a handle substrate, an insulator layer, and a topmost semiconductor material layer. The handle substrate and the topmost semiconductor material layer may be formed of a same material as the bulk semiconductor substrate aforementioned. The insulator layer may be a crystalline or non-crystalline dielectric material such as an oxide and/or nitride. For example, the insulator layer may be a dielectric oxide such as silicon oxide. For another example, the insulator layer may be a dielectric nitride such as silicon nitride or boron nitride. For yet another example, the insulator layer may include a stack of a dielectric oxide and a dielectric nitride such as a stack of, in any order, silicon oxide and silicon nitride or boron nitride. The insulator layer may have a thickness between about 10 nm and about 200 nm.

In some embodiments, the substrate 101 may be doped with a dopant such as phosphorus, arsenic, antimony, or boron and may have a first electrical type. The substrate 101 may have a first dopant concentration.

With reference to FIG. 2, a first hard mask layer 601 may be formed on the substrate 101. The first hard mask layer 601 may be formed of, for example, silicon oxide, silicon nitride, silicon oxynitride, silicon nitride oxide, boron nitride, silicon boron nitride, phosphorus boron nitride, or boron carbon silicon nitride. The first hard mask layer 601 may include a pattern of the first trenches 701.

It should be noted that, in the present disclosure, silicon oxynitride refers to a substance which contains silicon, nitrogen, and oxygen and in which a proportion of oxygen is greater than that of nitrogen. Silicon nitride oxide refers to a substance which contains silicon, oxygen, and nitrogen and in which a proportion of nitrogen is greater than that of oxygen.

With reference to FIG. 2, an etch process, such as an anisotropic dry etch process, may be performed to remove portions of the substrate 101 and concurrently form the first trenches 701. The first trenches 701 may extend downwardly from a top surface 101TS of the top surface 101TS. A pillar portion 101P of the substrate 101 may be formed between an adjacent pair of the first trenches 701. Each of the first trenches 701 may include two sidewalls 701S and a bottom surfaces 701B. In some embodiments, an aspect ratio of the first trenches 701 may be between about 1:6 and about 1:20. In some embodiments, the bottom surfaces 701B of the first trenches 701 may be rounded.

It should be noted that only two first trenches 701 are shown in FIG. 2 for clarity. The number of first trenches 701 can be more than one.

It should be noted that, in the description of the present disclosure, a surface of an element (or a feature) located at the highest vertical level along the direction Z is referred to as a top surface of the element (or the feature). A surface of an element (or a feature) located at the lowest vertical level along the direction Z is referred to as a bottom surface of the element (or the feature).

Figure 3:
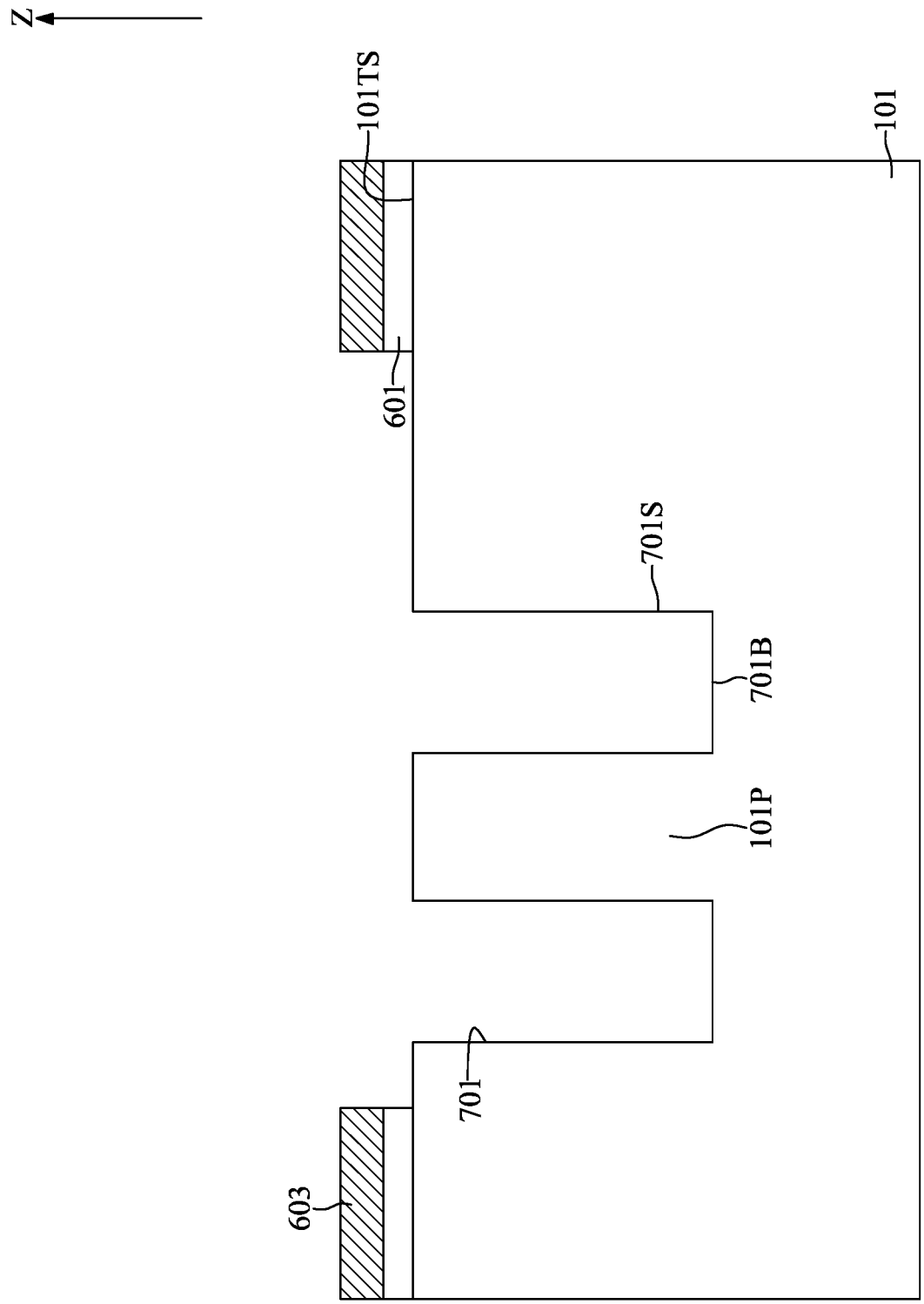

With reference to FIG. 3, a first mask layer 603 may be formed on the first hard mask layer 601. The first mask layer 603 may be a photoresist layer and may have a pattern of the bottom conductive structure 200. Some portions of the first hard mask layer 601 may be exposed through the pattern of the first mask layer 603. For example, the portion of the first hard mask layer 601 on the pillar portion 101P of the substrate 101 may not be covered by the first mask layer 603. Subsequently, an etch process, such as wet etch process, may be performed to remove the exposed portions of the first hard mask layer 601. The etch rate ratio of the first hard mask layer 601 to the substrate 101 may be between about 100:1 and about 1.05:1, between about 15:1 and about 2:1, or between about 10:1 and about 2:1 during the etch process. After the etch process, the first mask layer 603 may be removed.

Figure 4:
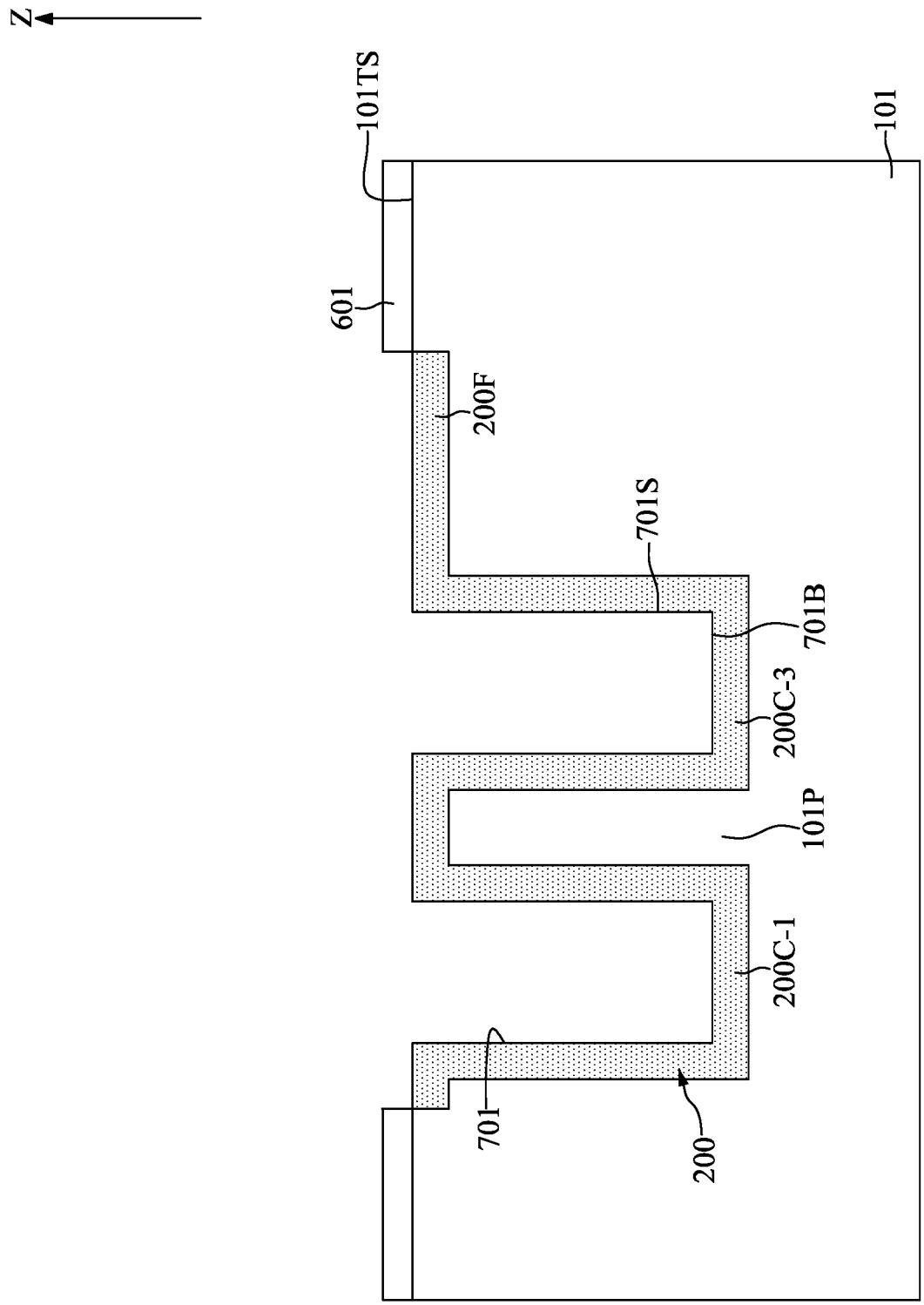

With reference to FIG. 4, an implantation process may be performed to dope regions of the substrate 101 and turn these regions of the substrate 101 into the bottom conductive structure 200. In some embodiments, the regions adjacent to the exposed top surface 101TS of substrate 101 and the regions adjacent to the sidewalls 701S and the bottom surfaces 701B of the first trenches 701 may be turned into the bottom conductive structure 200. That is, the bottom conductive structure 200 may have a geometry that follows the contours of the first trenches 701. The dopant of the implantation process may be, for example, phosphorus, arsenic, antimony, or boron. The bottom conductive structure 200 may include a second electrical type opposite to the first electrical type. The bottom conductive structure 200 may have a second dopant concentration greater than the first dopant concentration of the substrate 101.

With reference to FIG. 4, the bottom conductive structure 200 may include flat portions 200F and concave portions 200C-1, 200C-3. The flat portions 200F of the bottom conductive structure 200 may be formed adjacent to the exposed top surface 101TS of substrate 101. The concave portions 200C-1, 200C-3 of the bottom conductive structure 200 may be formed adjacent to the sidewalls 701S and the bottom surfaces 701B of the first trenches 701. It should be noted that the pillar portion 101P located between the concave portions 200C-1, 200C-3 of the bottom conductive structure 200 may still undoped. The geometry of the pillar portion 101P may provide provides an increased amount of area for a first capacitor unit CAP1 which will be illustrated later. As a result, the presence of the pillar portion 101P may provide an increased capacitance of the semiconductor device 1A.

Figure 5:
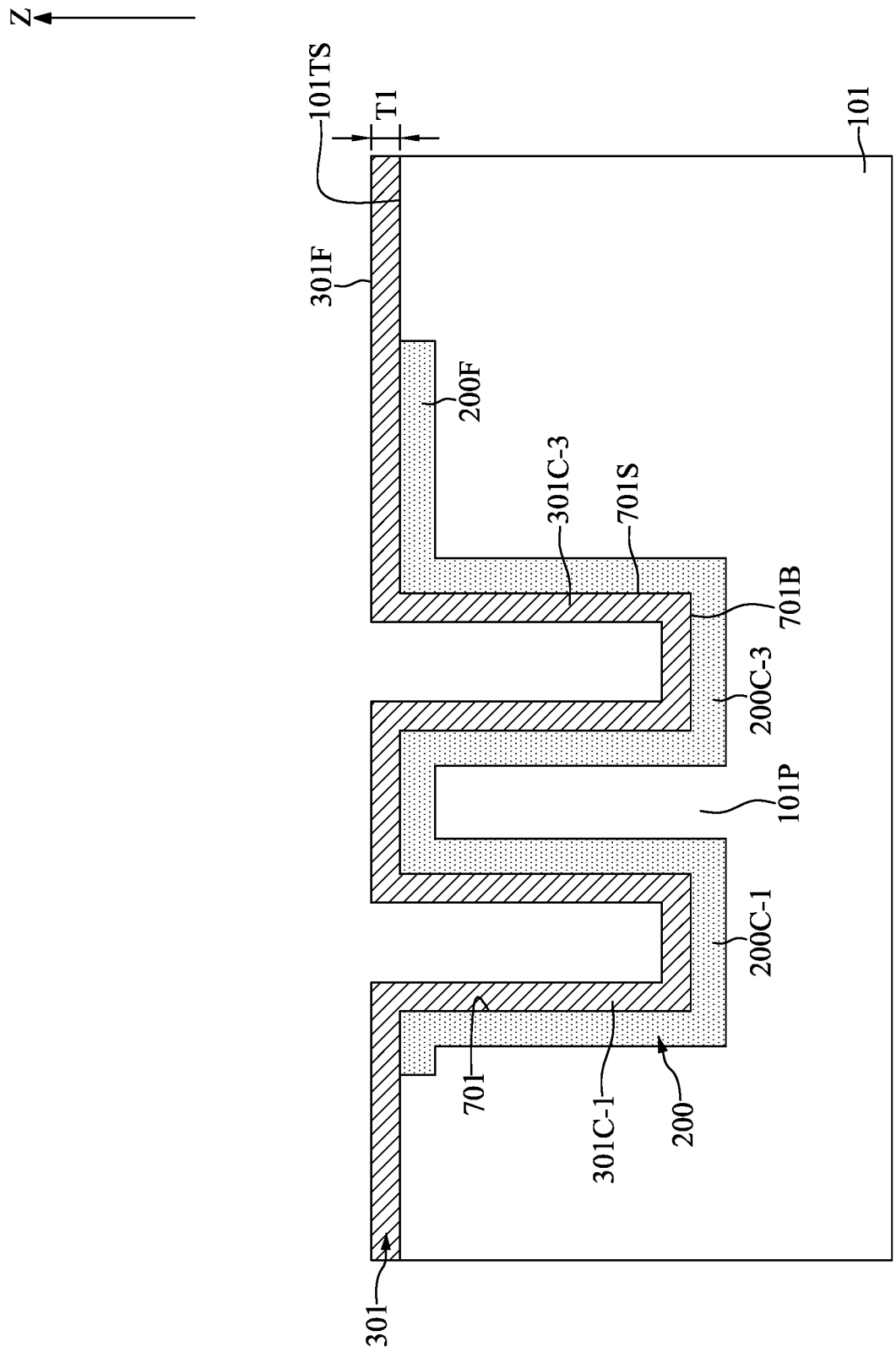

With reference to FIGS. 1 and 5, at step S13, a first insulating layer 301 may be conformally formed on the substrate 101 and in the first trenches 701.

With reference to FIG. 5, the first insulating layer 301 may be conformally formed on the top surface 101TS of the substrate 101, on the sidewalls 701S of the first trenches 701, and on the bottom surfaces 701B of the first trenches 701. The first insulating layer 301 may electrically isolate the bottom conductive structure 200 from conductive features, which will be fabricated later, above the first insulating layer 301. The first insulating layer 301 may include flat portion 301F and concave portions 301C-1, 301C-3. The flat portion 301F may be formed on the top surface 101TS of the substrate 101. The concave portions 301C-1, 301C-3 may be formed on the sidewalls 701S and bottom surfaces 701B of the first trenches 701. In some embodiments, the first insulating layer 301 may have a thickness T1 between about 10 angstroms and about 1000 angstroms. In some embodiments, the first insulating layer 301 may be formed by low pressure chemical vapor deposition, plasma-enhanced chemical vapor deposition, atomic layer deposition, or the like.

In some embodiments, the first insulating layer 301 may be a stacked layer structure such as an oxide-nitride-oxide structure. In some embodiments, the first insulating layer 301 may be formed of, for example, silicon oxide, silicon nitride, silicon oxynitride, silicon nitride oxide, or the like.

In some embodiments, the first insulating layer 301 may be formed of, for example, a high-k dielectric material such as metal oxide, metal nitride, metal silicate, transition metal-oxide, transition metal-nitride, transition metal-silicate, oxynitride of metal, metal aluminate, zirconium silicate, zirconium aluminate, or a combination thereof. In some embodiments, the first insulating layer 301 may be formed of hafnium oxide, hafnium silicon oxide, hafnium silicon oxynitride, hafnium tantalum oxide, hafnium titanium oxide, hafnium zirconium oxide, hafnium lanthanum oxide, lanthanum oxide, zirconium oxide, titanium oxide, tantalum oxide, yttrium oxide, strontium titanium oxide, barium titanium oxide, barium zirconium oxide, lanthanum silicon oxide, aluminum silicon oxide, aluminum oxide, silicon nitride, silicon oxynitride, silicon nitride oxide, or a combination thereof. In some embodiments, the first insulating layer 301 may be a stacked layer structure that includes, for example, one layer of silicon oxide and another layer of high-k dielectric material.

It should be noted that, a "thickness" refers to a vertical size of an element (e.g., a layer, trench, hole, opening, etc.) in the cross-sectional views measured from a top surface to a bottom surface of the element.

Figure 6:
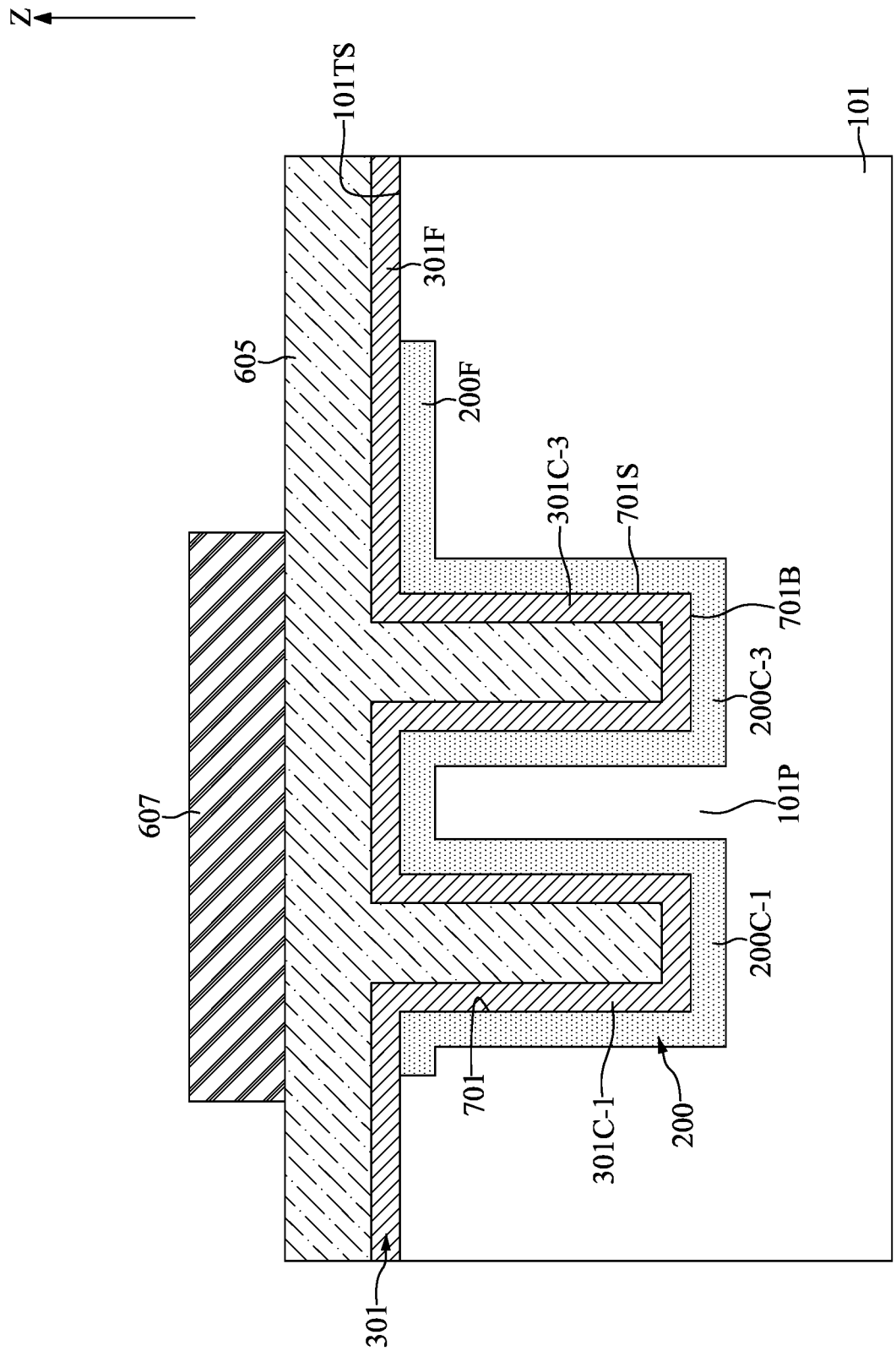
Figure 7:
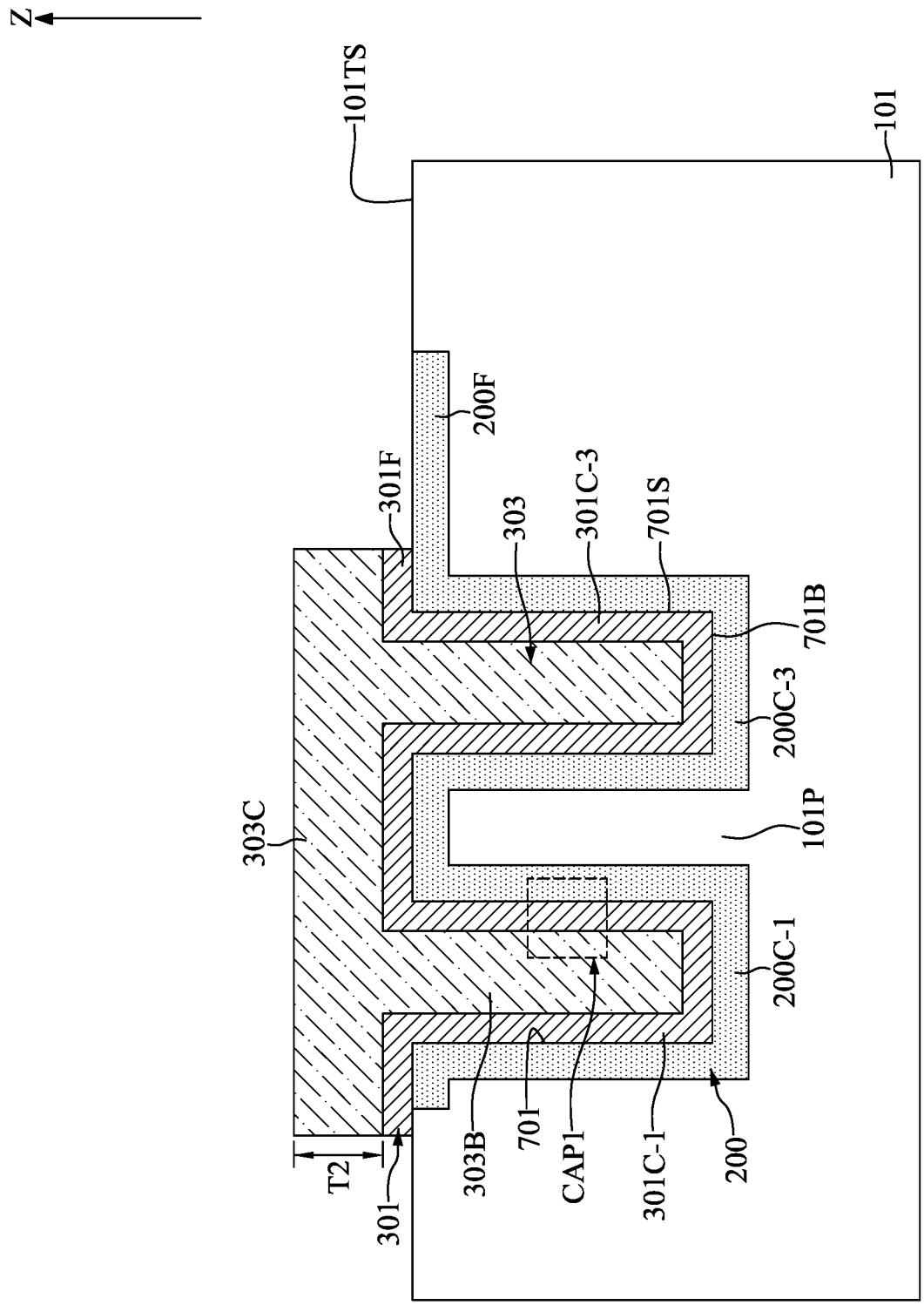

With reference to FIGS. 1, 6 and 7, at step S15, a shared conductive layer 303 may be formed on the first insulating layer 301.

With reference to FIG. 6, a layer of first conductive material 605 may be formed to fill the first trenches 701 and cover the first insulating layer 301. A planarization process, such as chemical mechanical polishing, may be performed to provide a substantially flat surface for subsequent processing steps.

In some embodiments, the first conductive material 605 may be, for example, polycrystalline silicon, doped polycrystalline silicon, polycrystalline silicon germanium, doped polycrystalline silicon germanium, aluminum, copper, platinum, gold, titanium, titanium nitride, tantalum, tantalum nitride, tungsten, tungsten nitride, or alloy of gold and copper.

In some embodiments, the first conductive material 605 may be, for example, a material from the class containing metal borides, metal phosphides, and metal antimonide of the transition metals from the secondary groups IV, V and VI of the periodic table. The transition metals may be titanium, zirconium, hafnium, vanadium, niobium, tantalum, chromium, molybdenum, or tungsten. In some embodiments, the material may be titanium diboride, zirconium diboride, hafnium diboride, titanium phosphide, zirconium phosphide, hafnium phosphide, titanium antimonide, zirconium antimonide, or hafnium antimonide. The aforementioned material may have a high thermal stability and excellent conductivity which specific resistance may be less than 20 micro Ohm-cm.

With reference to FIG. 6, a second mask layer 607 may be formed on the layer of first conductive material 605. The second mask layer 607 may be a photoresist layer and may have a pattern of the shared conductive layer 303.

With reference to FIG. 7, an etch process, such as an anisotropic dry etch process, may be performed to remove portions of the layer of first conductive material 605 and portions of the first insulating layer 301. After the etch process, the layer of first conductive material 605 may be turned into the shared conductive layer 303 and the first insulating layer 301 may be trimmed. A portion of the flat portions 200F of the bottom conductive structure 200 may be exposed. After the etch process, the second mask layer 607 may be removed.

With reference to FIG. 7, the shared conductive layer 303 may include a connection portion 303C and bottom portions 303B. The connection portion 303C of the shared conductive layer 303 may be horizontally above the top surface 101TS of the substrate 101 and on the flat portion 301F of the first insulating layer 301. The connection portion 303C of the shared conductive layer 303 may have a thickness T2 between about 50 angstroms and about 1000 angstroms. The bottom portions 303B of the shared conductive layer 303 may downwardly extend from the connection portion 303C of the shared conductive layer 303 and toward to the substrate 101. The concave portions 301C-1, 301C-3 of the first insulating layer 301 may surround the bottom portions 303B of the shared conductive layer 303.

It should be noted that "an element A surrounds an element B" (or similar language) as used herein means that the element A is at least partially around the element B but does not necessarily mean that the element A completely encloses the element B.

With reference to FIG. 7, the bottom conductive structure 200, the first insulating layer 301, and the shared conductive layer 303 together configure the first capacitor unit CAP1.

Figure 8:
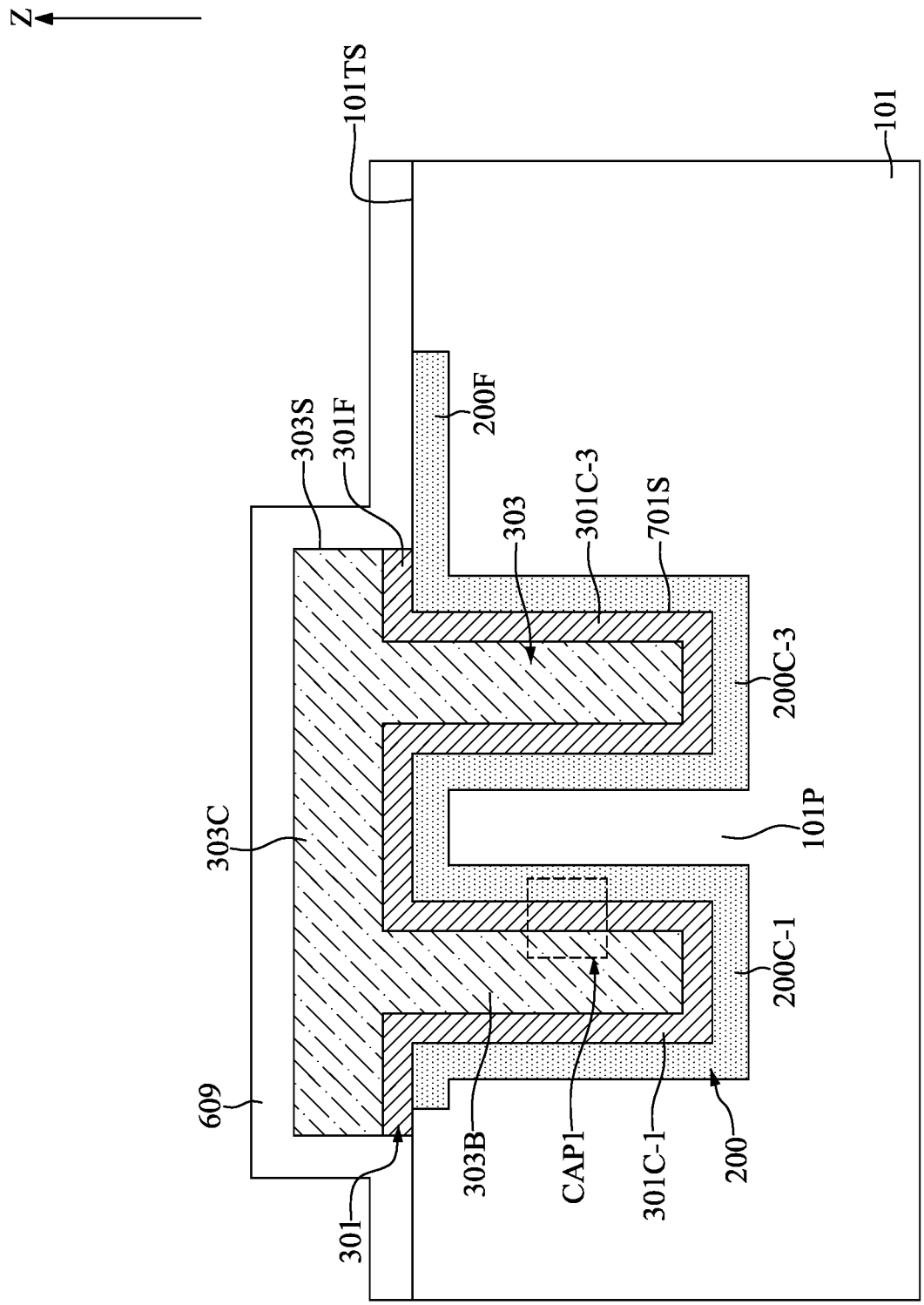
Figure 9:
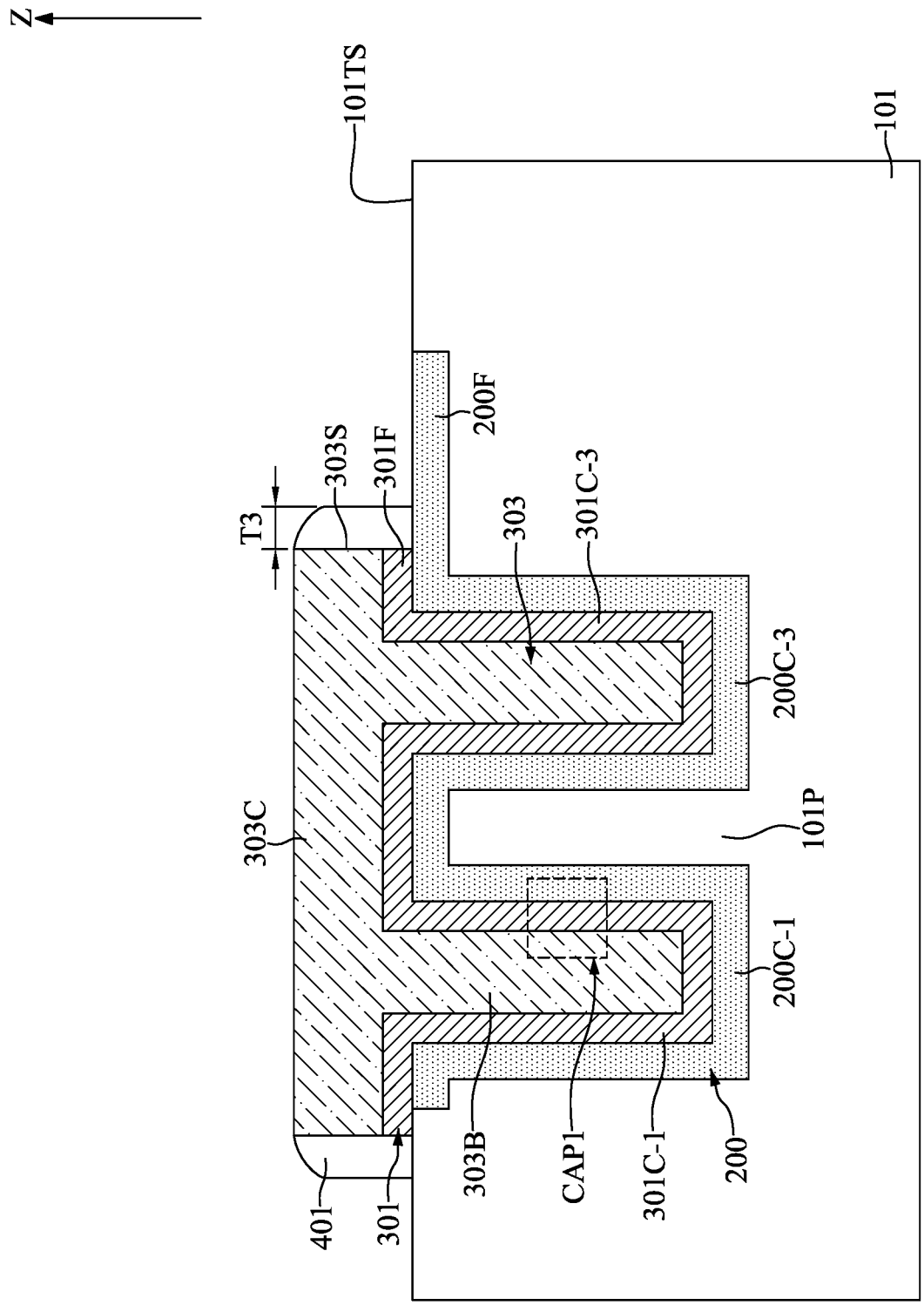

With reference to FIGS. 1, 8, and 9, at step S17, first spacers 401 may be formed on sidewalls 303S of the shared conductive layer 303.

With reference to FIG. 8, a layer of first insulating material 609 may be formed to cover the top surface 101TS of the substrate 101, the sidewalls of the first insulating layer 301, the sidewalls 303S and the top surface of the shared conductive layer 303. In some embodiments, the first spacers 401 may have a thickness T3 between about 1 nm and about 3 nm. In some embodiments, the first insulating material 609 may be for example, a semiconductor oxide, a semiconductor nitride, a semiconductor carbide, a semiconductor oxynitride, or a combination thereof.

With reference to FIG. 9, an etch process, such as an anisotropic dry etch process, may be performed to remove portions of the layer of first insulating material 609 and concurrently turn the layer of first insulating material 609 into the first spacers 401. The first spacers 401 may provide additional electrical isolation to the shared conductive layer 303 in the horizontal direction.

Figure 10:
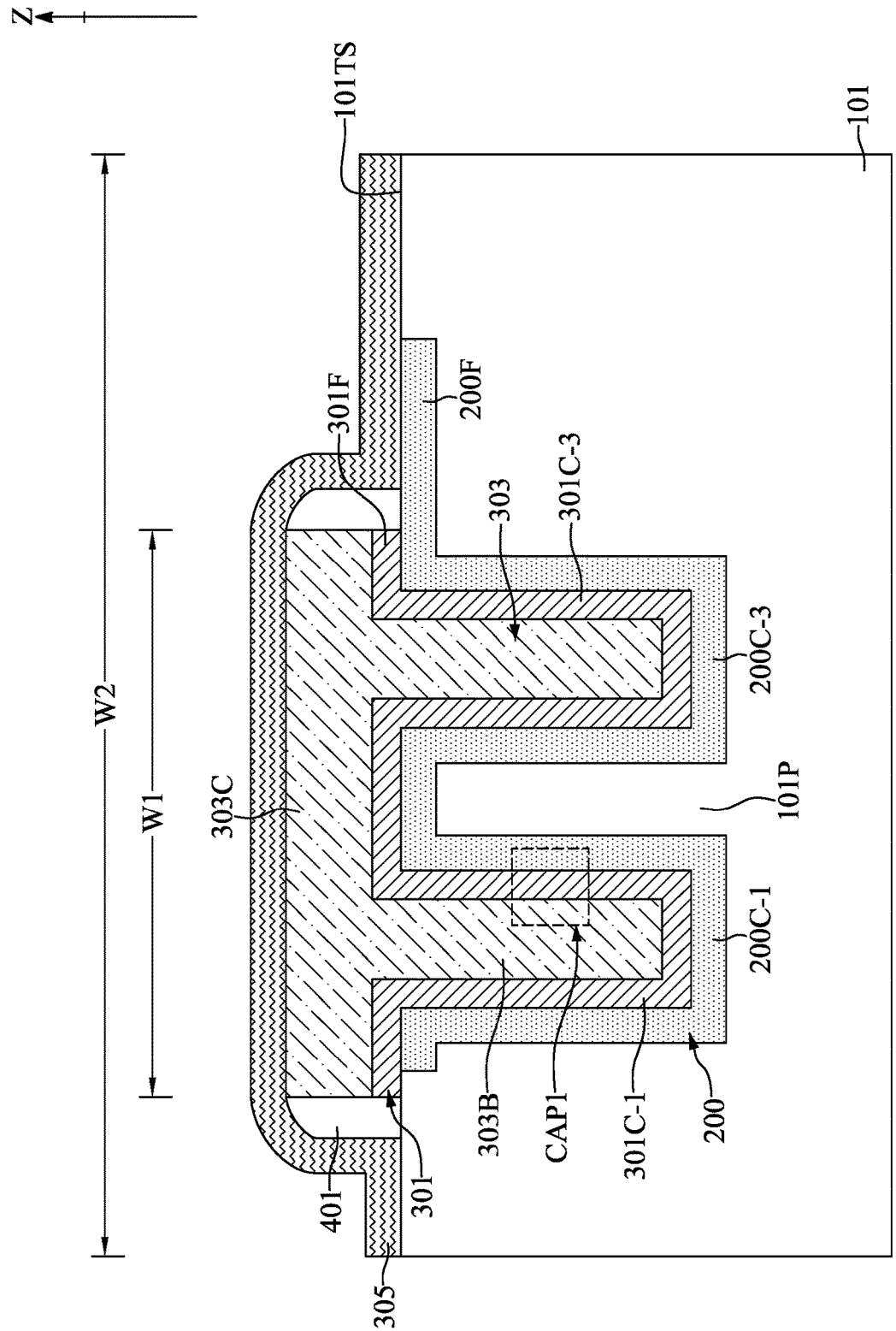

With reference to FIGS. 1 and 10, at step S19, a second insulating layer 305 may be conformally formed on the shared conductive layer 303.

With reference to FIG. 10, the second insulating layer 305 may be formed to cover the top surface 101TS of the substrate 101, the first spacers 401, and the shared conductive layer 303. A width W2 of the second insulating layer 305 may be greater than a width W1 of the shared conductive layer 303. The second insulating layer 305 may be formed of a same material as the first insulating layer 301 but is not limited thereto. The second insulating layer 305 may electrically isolate the shared conductive layer 303 from conductive features, which will be fabricated later, above the second insulating layer 305.

It should be noted that, a "width" refers to a size of an element (e.g., a layer, trench, hole, opening, etc.) in the drawings measured from a side surface to an opposite surface of the element. The term "thickness" may substitute for "width" where indicated.

Figure 11:
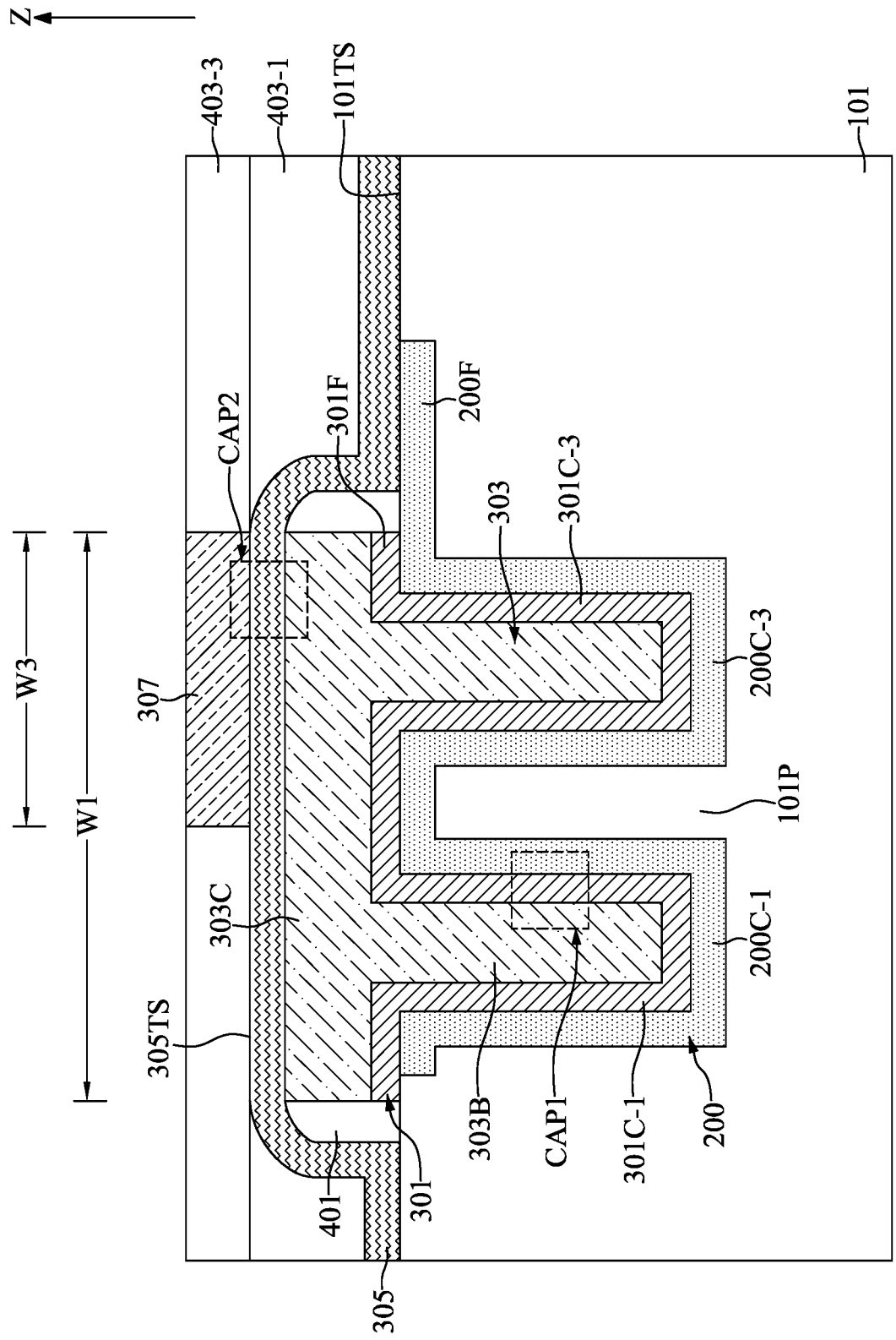

With reference to FIGS. 1 and 11, at step S21, a top conductive layer 307 may be formed on the second insulating layer 305.

With reference to FIG. 11, an inter-layer dielectric 403-1 may be formed to cover the second insulating layer 305. A planarization process, such as chemical mechanical polishing, may be performed until the top surface 305TS of the second insulating layer 305 is exposed to remove excess material and provide a substantially flat surface for subsequent processing steps. An inter-layer dielectric 403-3 may be sequentially formed on the inter-layer dielectric 403-1. The inter-layer dielectrics 403-1, 403-3 may be formed of a low-k dielectric material such as phosphosilicate glass, borophosphosilicate glass, fluorinated silicate glass, spin-on-glass, spin-on-polymers, silicon carbon material, or a combination thereof. The inter-layer dielectrics 403-1, 403-3 may act as an insulator that supports and isolates the top conductive layer 307 as will be illustrated later.

With reference to FIG. 11, the top conductive layer 307 may be formed on the second insulating layer 305 and in the inter-layer dielectric 403-3. A width W3 of the top conductive layer 307 may be less than a width W1 of the shared conductive layer 303. In some embodiments, the top conductive layer 307 may be formed of, for example, polycrystalline silicon, doped polycrystalline silicon, polycrystalline silicon germanium, doped polycrystalline silicon germanium, aluminum, copper, platinum, gold, titanium, titanium nitride, tantalum, tantalum nitride, tungsten, tungsten nitride, or alloy of gold and copper. For example, the top conductive layer 307 may be formed of copper and may be formed by a damascene process. In some embodiments, the top conductive layer 307 may be formed of a same material as the shared conductive layer 303.

With reference to FIG. 11, the shared conductive layer 303, the second insulating layer 305, and the top conductive layer 307 together configure a second capacitor unit CAP2.

Figure 12:
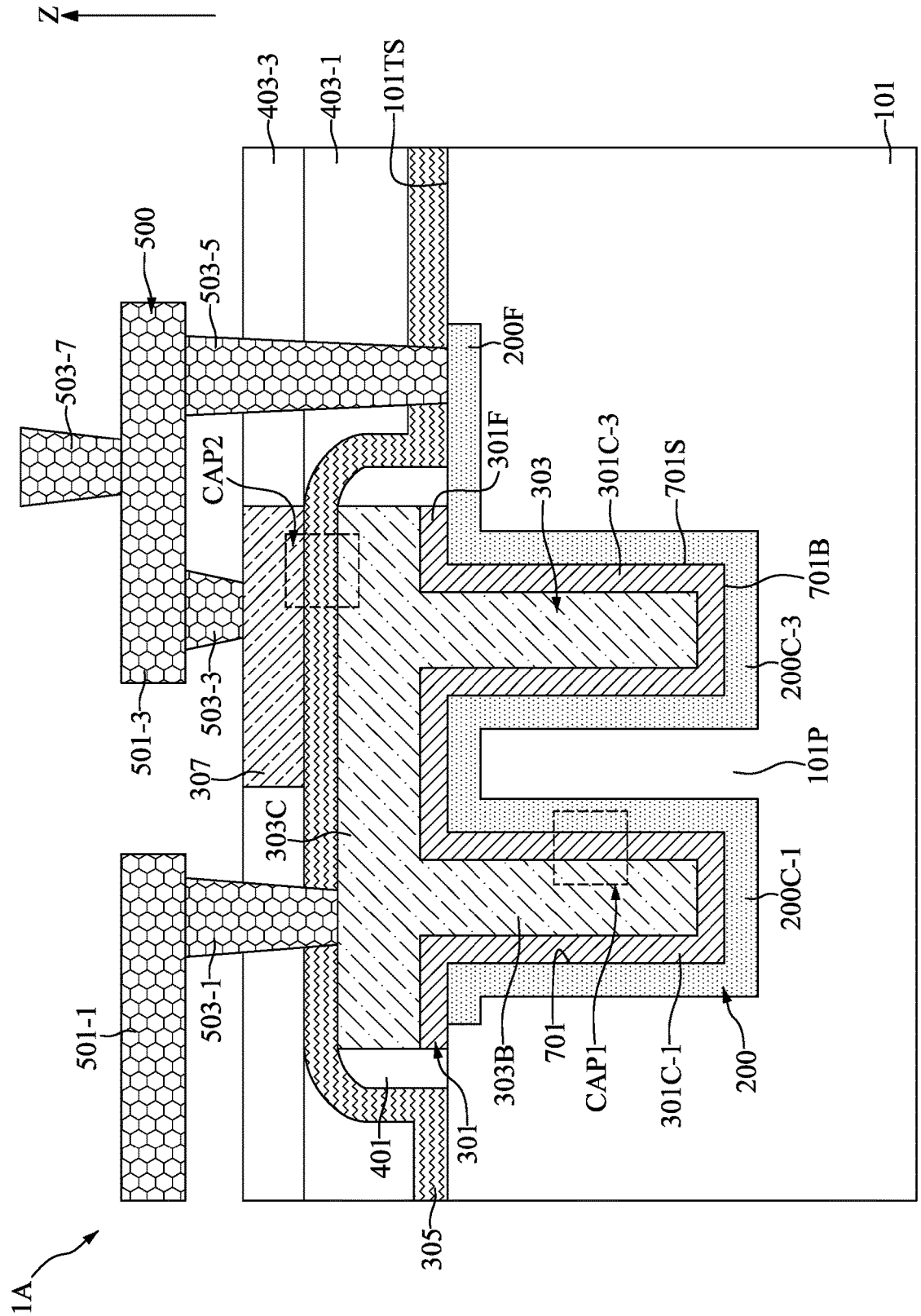
Figure 13:
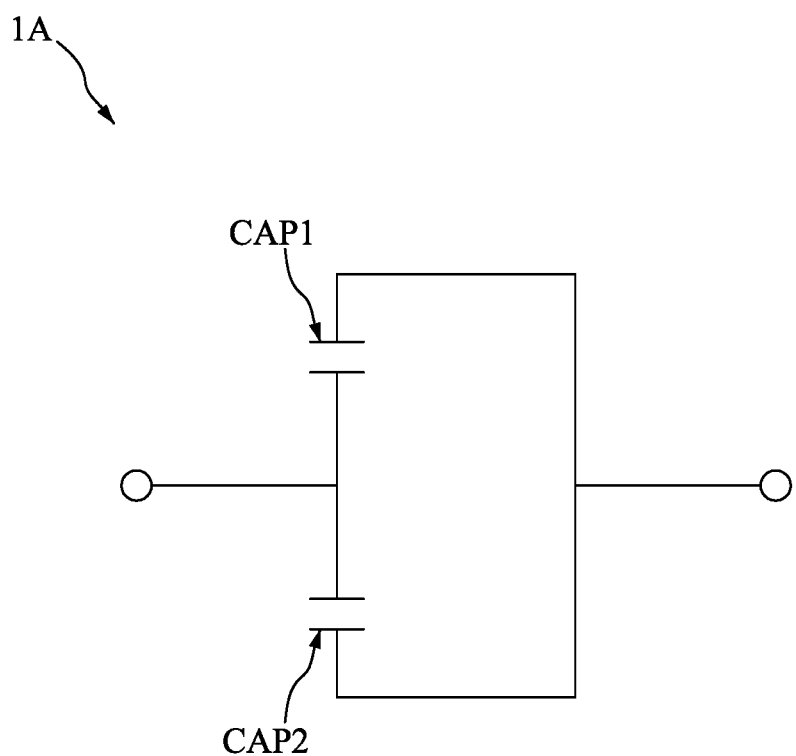
FIG. 13 illustrates, in a schematic circuit diagram, the semiconductor device in accordance with one embodiment of the present disclosure.

With reference to FIGS. 1 and 12, at step S23, a connection structure 500 may be formed to electrically couple the bottom conductive structure 200 and the top conductive layer 307.

With reference to FIG. 12, the connection structure 500 may include conductive lines 501-1, 501-3 and conductive vias 503-1, 503-3, 503-5, 503-7. The conductive lines 501-1, 501-3 may be formed above the inter-layer dielectric 403-3 and may be horizontally disposed. The conductive via 503-1 may be formed electrically connecting the conductive line 501-1 and the shared conductive layer 303. The conductive via 503-3 may be formed electrically connecting the conductive line 501-3 and the top conductive layer 307. The conductive via 503-5 may be formed electrically connecting the conductive line 501-3 and the bottom conductive structure 200. The conductive via 503-7 may be formed on the conductive line 501-3.

In some embodiments, the conductive lines 501-1, 501-3 and the conductive vias 503-1, 503-3, 503-5, 503-7 may be formed of, for example, conductive metal nitride (e.g., titanium nitride or tantalum nitride) or metal (e.g., titanium, tantalum, tungsten, copper, or aluminum).

It should be noted that the inter-layer dielectric which supports and isolates the conductive lines 501-1, 501-3 and the conductive vias 503-1, 503-3, 503-5, 503-7 may be omitted in FIG. 12 for clarity.

With reference to FIGS. 12 and 13, the first capacitor unit CAP1 and the second capacitor unit CAP2 may be stacked together and may be electrically coupled in parallel by the connection structure 500 to increase the capacitance density. Accordingly, the effective capacitance of the semiconductor device 1A may be increased. As a result, the performance of the semiconductor device 1A may be improved.

Figure 14:
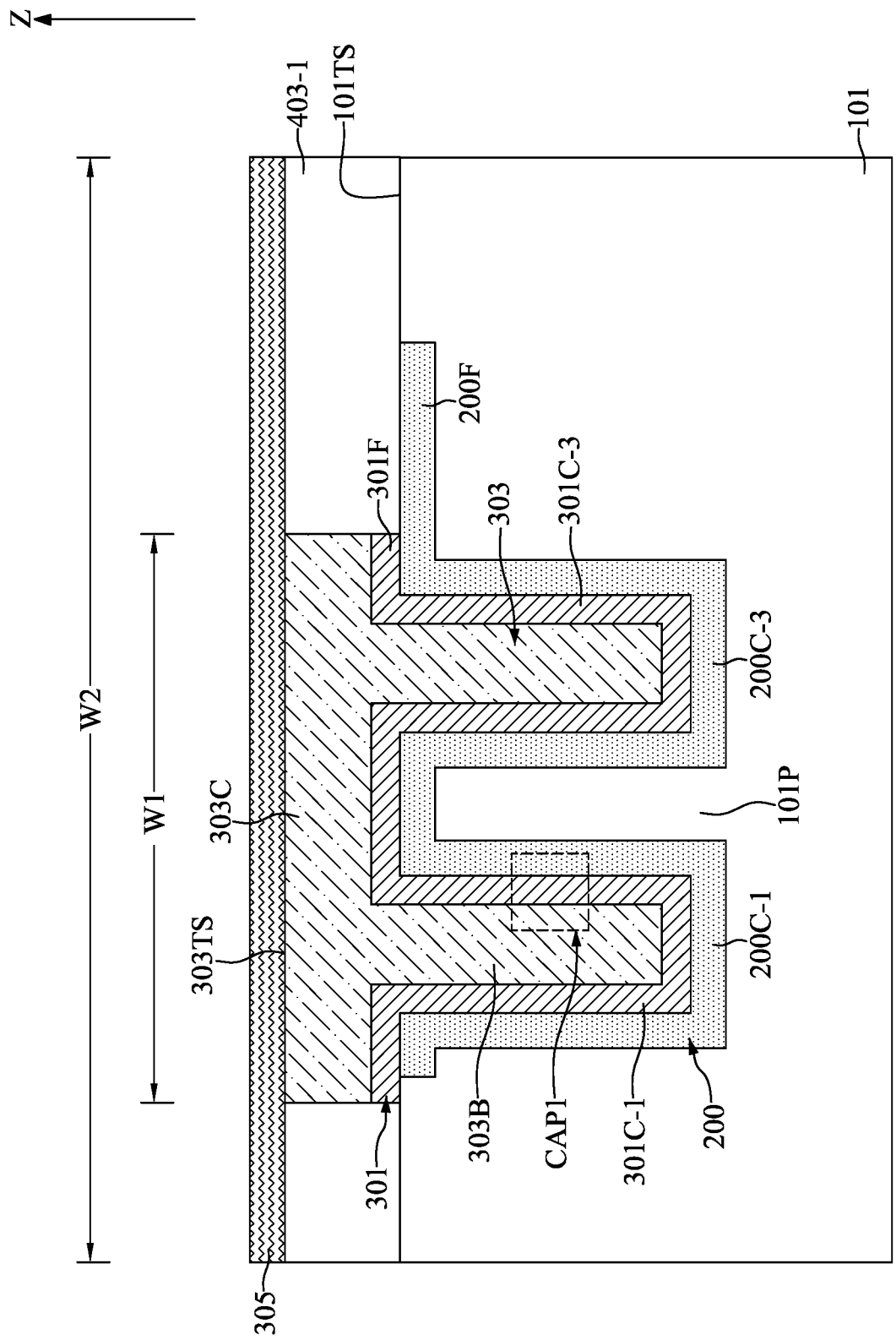
FIGS. 14 and 15 illustrate, in schematic cross-sectional view diagrams, part a flow for fabricating a semiconductor device in accordance with another embodiment of the present disclosure.
Figure 15:
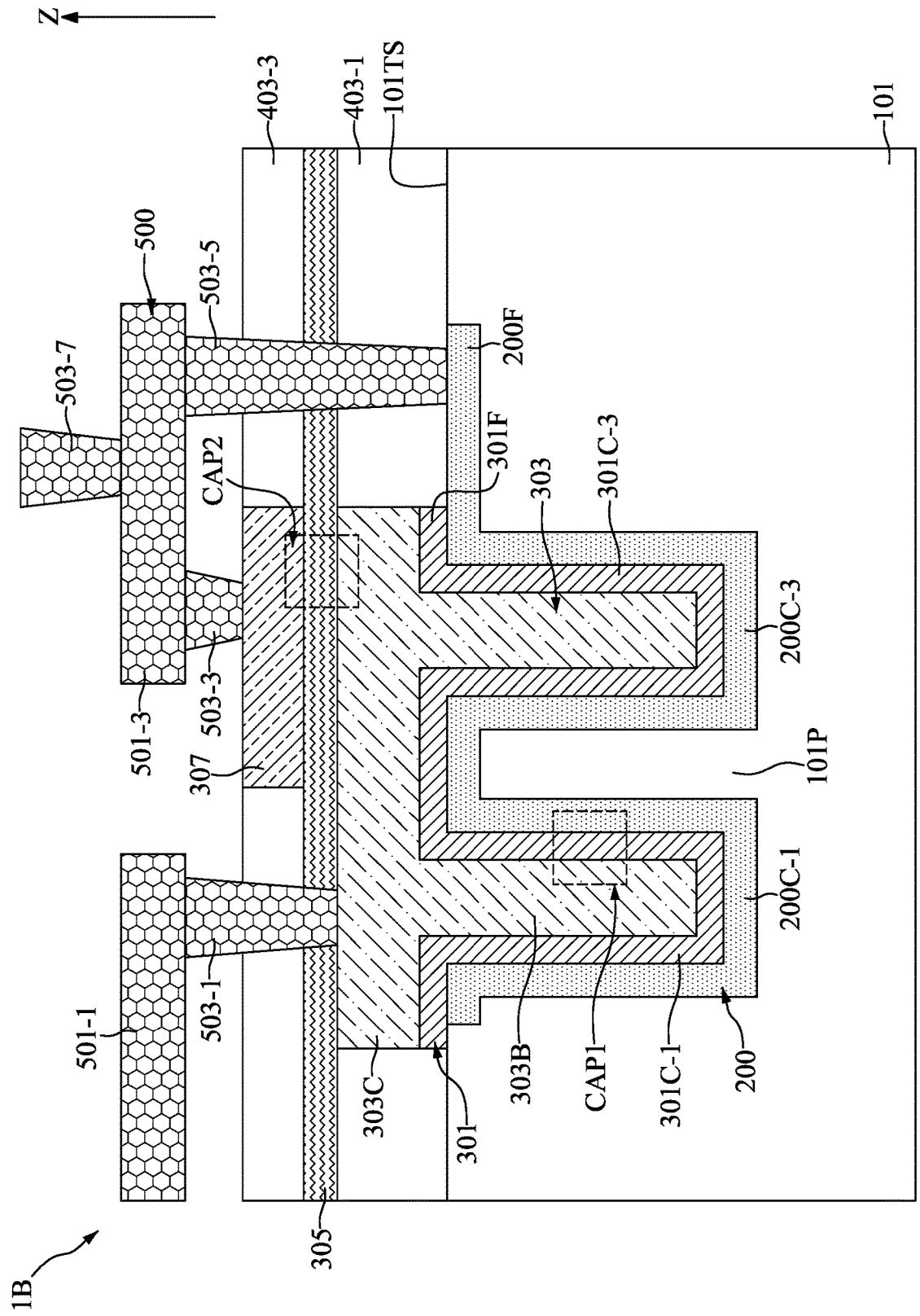

FIGS. 14 and 15 illustrate, in schematic cross-sectional view diagrams, part a flow for fabricating a semiconductor device 1B in accordance with another embodiment of the present disclosure.

With reference to FIG. 14, an intermediate semiconductor device may be fabricating with a procedure similar to that illustrated in FIGS. 2 to 7. The inter-layer dielectric 403-1 may be formed to cover the top surface 101TS of the substrate 101, the first insulating layer 301, and the shared conductive layer 303. A planarization process, such as chemical mechanical polishing, may be performed until the top surface 303TS of the shared conductive layer 303 is exposed to provide a substantially flat surface for subsequent processing steps. Subsequently, the second insulating layer 305 may be formed on the shared conductive layer 303 and on the inter-layer dielectric 403-1. The width W2 of the second insulating layer 305 may be greater than the width W1 of the shared conductive layer 303.

With reference to FIG. 15, the inter-layer dielectric 403-3, the top conductive layer 307, and the connection structure 500 may be formed with a procedure similar to that illustrated in FIGS. 11 and 12.

FIGS. 16 to 19 illustrate, in schematic cross-sectional view diagrams, semiconductor devices 1C, 1D, 1E, and 1F in accordance with some embodiments of the present disclosure.

Figure 16:
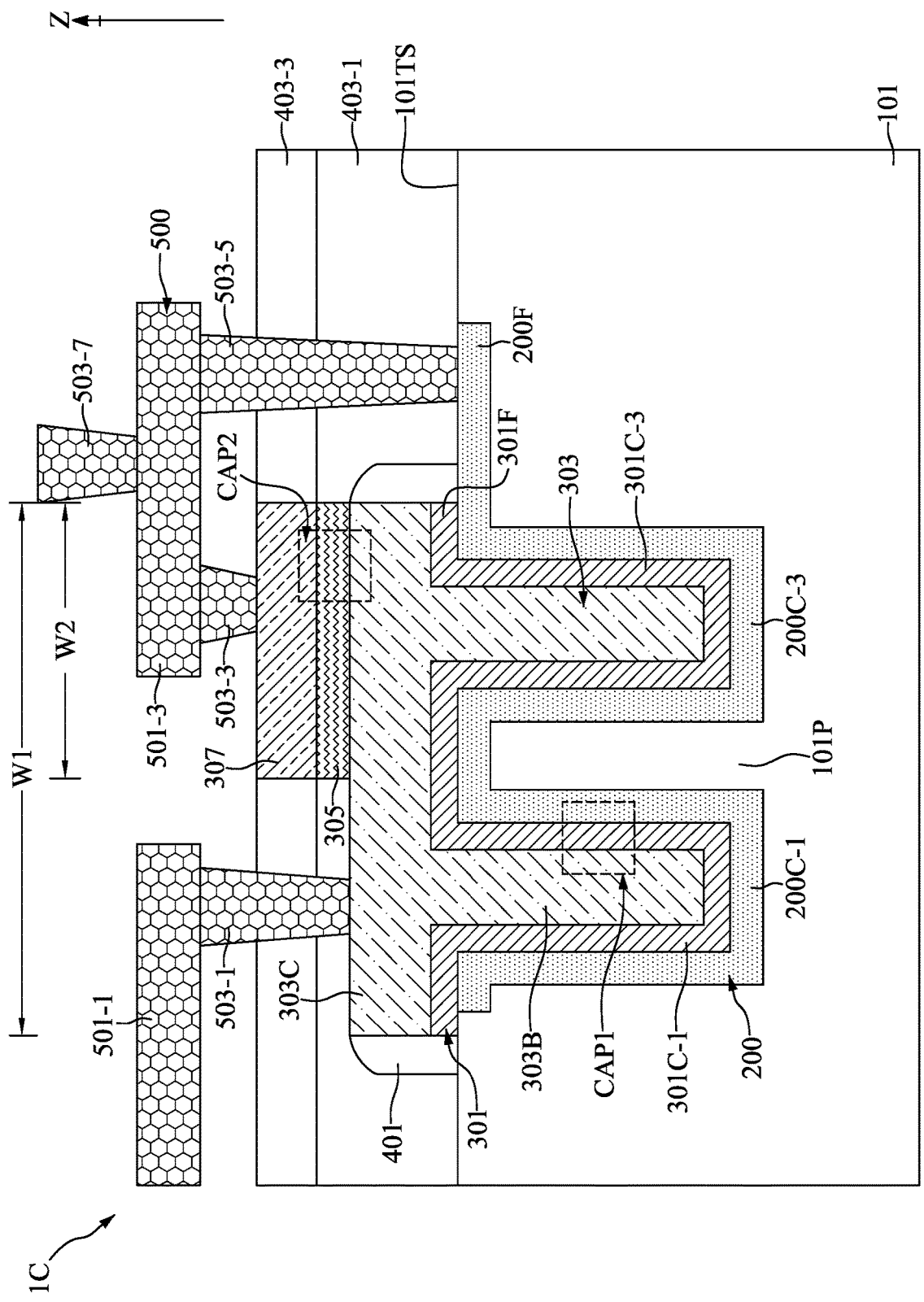
FIGS. 16 to 19 illustrate, in schematic cross-sectional view diagrams, semiconductor devices in accordance with some embodiments of the present disclosure.

With reference to FIG. 16, the semiconductor device 1C may have a structure similar to that illustrated in FIG. 15. The same or similar elements in FIG. 16 as in FIG. 15 have been marked with similar reference numbers and duplicative descriptions have been omitted. The width W2 of the second insulating layer 305 may be less than the width W1 of the shared conductive layer 303.

Figure 17:
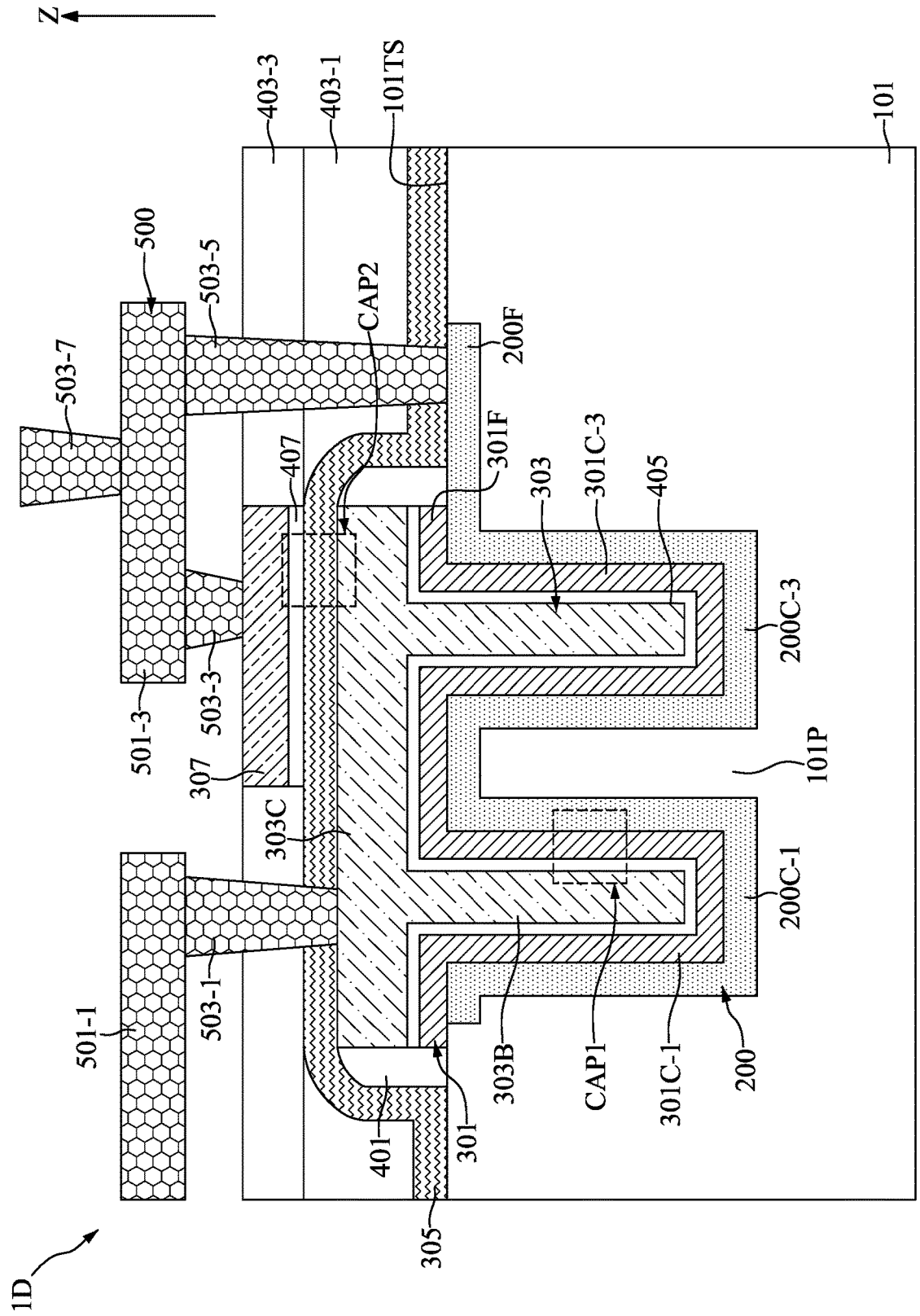

With reference to FIG. 17, the semiconductor device 1D may have a structure similar to that illustrated in FIG. 12. The same or similar elements in FIG. 17 as in FIG. 12 have been marked with similar reference numbers and duplicative descriptions have been omitted.

With reference to FIG. 17, the semiconductor device 1D may include a first barrier layer 405 and a second barrier layer 407. The first barrier layer 405 may be disposed between the first insulating layer 301 and the shared conductive layer 303. The second barrier layer 407 may be disposed between the second insulating layer 305 and the top conductive layer 307. The first barrier layer 405 and the second barrier layer 407 may have thicknesses between about 10 angstroms and about 15 angstroms or between about 11 angstroms and about 13 angstroms. The first barrier layer 405 and the second barrier layer 407 may be formed of, for example, titanium, titanium nitride, titanium silicon nitride, tantalum, tantalum nitride, tantalum silicon nitride, or combination thereof. The first barrier layer 405 may improve the adhesion between the first insulating layer 301 and the shared conductive layer 303. The second barrier layer 407 may improve the adhesion between the second insulating layer 305 and the top conductive layer 307.

Figure 18:
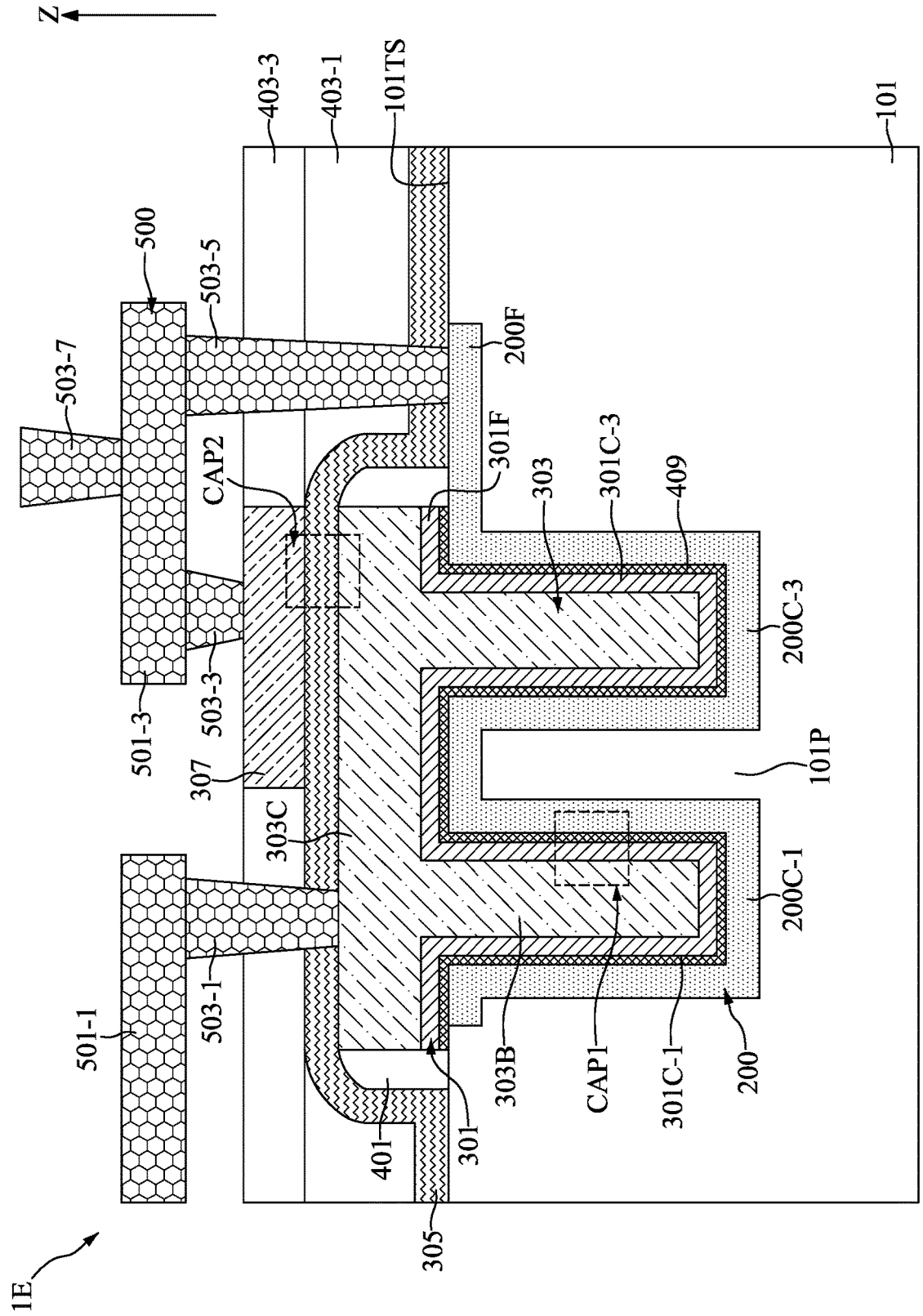

With reference to FIG. 18, the semiconductor device 1E may have a structure similar to that illustrated in FIG. 12. The same or similar elements in FIG. 18 as in FIG. 12 have been marked with similar reference numbers and duplicative descriptions have been omitted.

With reference to FIG. 18, the semiconductor device 1E may include an interfacial layer 409. The interfacial layer 409 may be disposed between the first insulating layer 301 and the bottom conductive structure 200. The interfacial layer 409 may have a thickness between about 7 angstroms and 12 angstroms or between about 8 angstroms and 10 angstroms. The interfacial layer 409 may facilitate the formation of the first insulating layer 301 during fabrication of the semiconductor device 1E.

Figure 19:
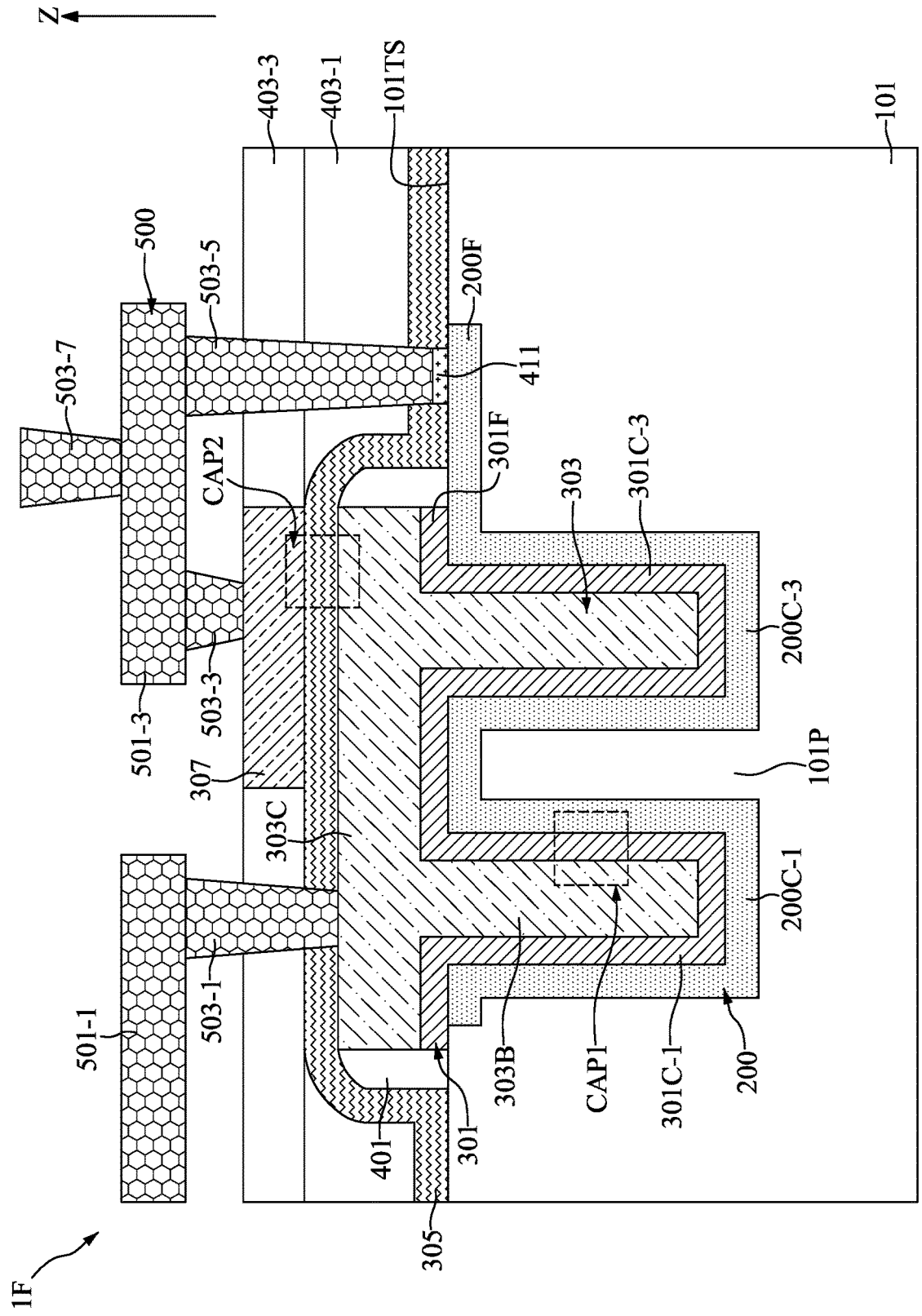

With reference to FIG. 19, the semiconductor device 1F may have a structure similar to that illustrated in FIG. 12. The same or similar elements in FIG. 19 as in FIG. 12 have been marked with similar reference numbers and duplicative descriptions have been omitted.

With reference to FIG. 19, the semiconductor device 1F may include an assistant conductive layer 411. The assistant conductive layer 411 may be disposed between the conductive via 503-5 and the flat portions 200F of the bottom conductive structure 200. The assistant conductive layer 411 may have a thickness between about 2 nm and about 20 nm. The assistant conductive layer 411 may be formed of, for example, titanium silicide, nickel silicide, nickel platinum silicide, tantalum silicide, or cobalt silicide. The assistant conductive layer 411 may reduce the contact resistance between the conductive via 503-5 and the flat portions 200F of the bottom conductive structure 200.

Figure 20:
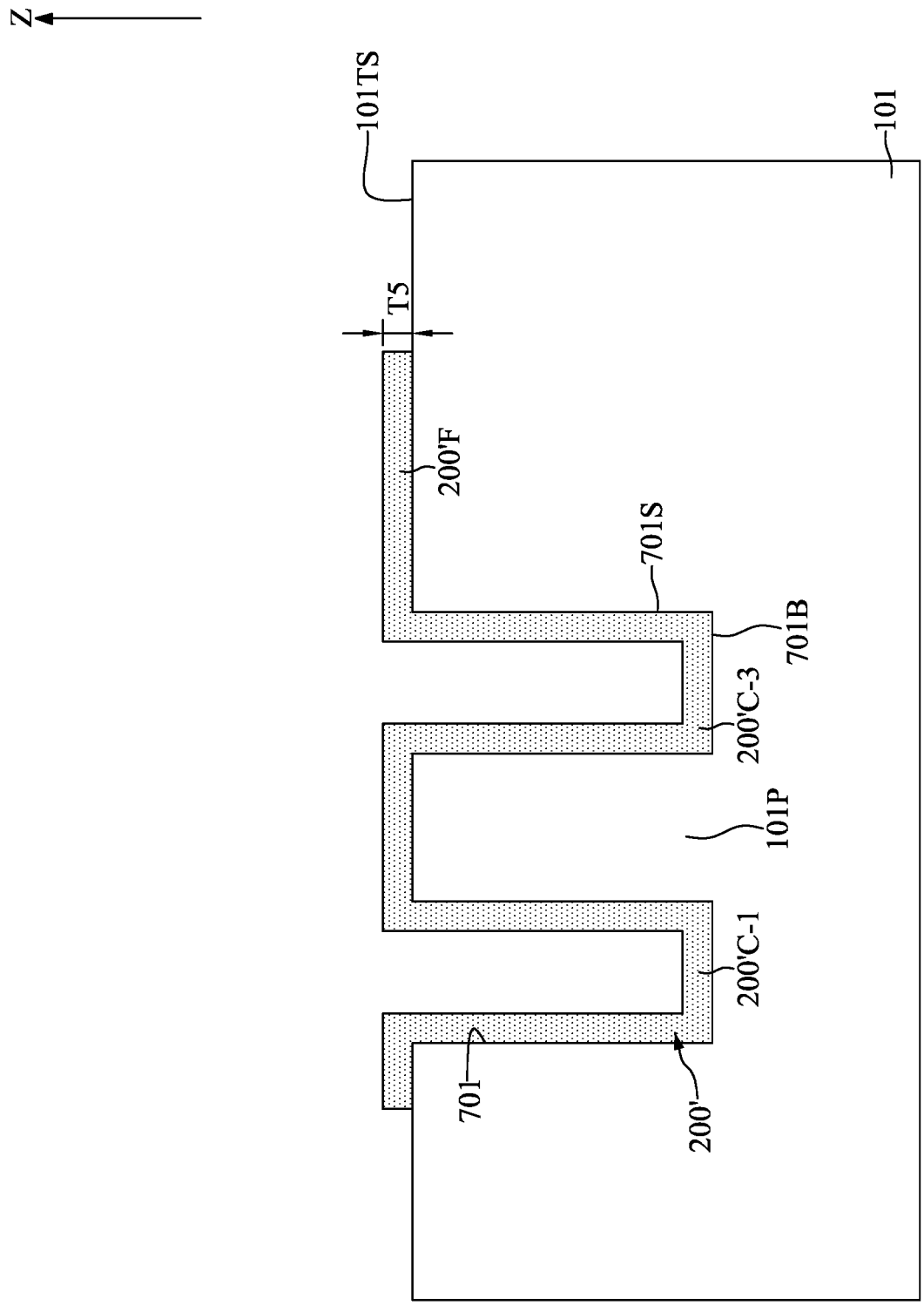
FIGS. 20 and 21 illustrate, in schematic cross-sectional view diagrams, part a flow for fabricating a semiconductor device in accordance with another embodiment of the present disclosure.
Figure 21:
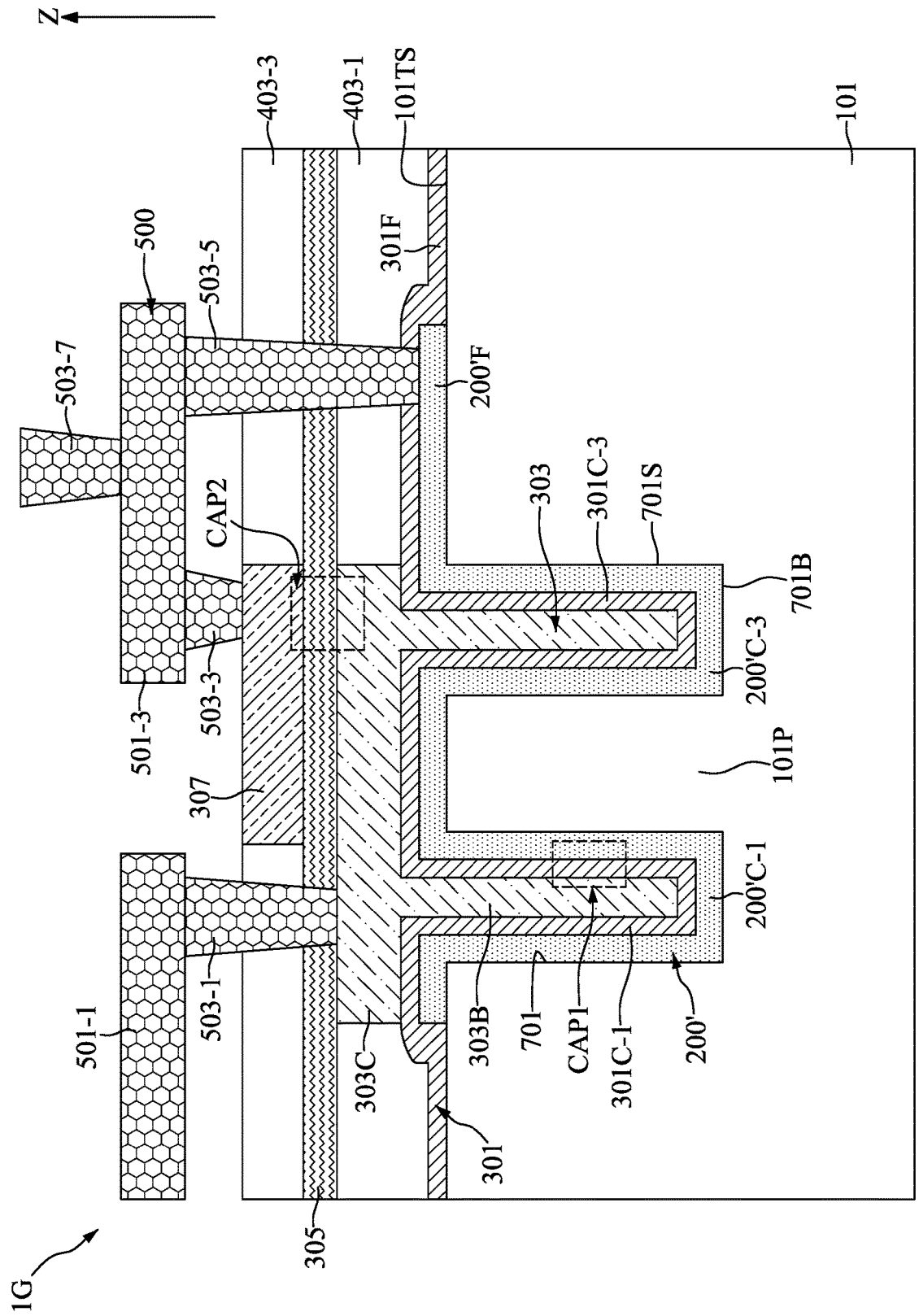

FIGS. 20 and 21 illustrate, in schematic cross-sectional view diagrams, part a flow for fabricating a semiconductor device 1G in accordance with another embodiment of the present disclosure.

With reference to FIG. 20, the substrate 101 and the first trenches 701 may be formed with a procedure similar to that illustrated in FIG. 2. A bottom conductive structure 200' may be conformally formed in the first trenches 701 and on the top surface 101TS of the substrate 101. The bottom conductive structure 200' may include flat portions 200'F and concave portions 200'C-1, 200'C-3. The flat portions 200'F may be formed on the top surface 101TS of the substrate 101. The concave portions 200'C-1, 200'C-3 may be formed on the sidewalls 701S and the bottom surfaces 701B of the first trenches 701. The bottom conductive structure 200' may have a thickness T5 between about 50 angstroms and about 1000 angstroms.

The bottom conductive structure 200' may be formed by a deposition process. In some embodiments, an etch process may be subsequently performed after the deposition process to trim the bottom conductive structure 200'. The deposition process may be chemical vapor deposition, plasma-enhanced chemical vapor deposition, physical vapor deposition, atomic layer deposition, or the like. The bottom conductive structure 200' may be formed of, for example, polycrystalline silicon, doped polycrystalline silicon, polycrystalline silicon germanium, doped polycrystalline silicon germanium, aluminum, copper, platinum, gold, titanium, titanium nitride, tantalum, tantalum nitride, tungsten, tungsten nitride, or alloy of gold and copper.

With reference to FIG. 21, the first insulating layer 301 may be conformally formed on the top surface 101TS of the substrate 101 and on the bottom conductive structure 200'.

In some embodiments, the flat portion 301F of the first insulating layer 301 may be formed on the top surface 101TS of the substrate 101 and on the flat portions 200'F of the bottom conductive structure 200'. The concave portions 301C-1, 301C-3 of the first insulating layer 301 may be formed on the concave portions 200'C-1, 200'C-3 of the bottom conductive structure 200' and in the first trenches 701. The shared conductive layer 303, the second insulating layer 305, the top conductive layer 307, the inter-layer dielectrics 403-1, 403-3, and the connection structure 500 may be formed with a procedure similar to that illustrated in FIGS. 14 and 15.

With reference to FIG. 21, the bottom conductive structure 200', the first insulating layer 301, and the shared conductive layer 303 together configure the first capacitor unit CAP1. The shared conductive layer 303, the second insulating layer 305, and the top conductive layer 307 together configure the second capacitor unit CAP2. The first capacitor unit CAP1 and the second capacitor unit CAP2 may be electrical parallel by the connection structure 500.

Figure 22:
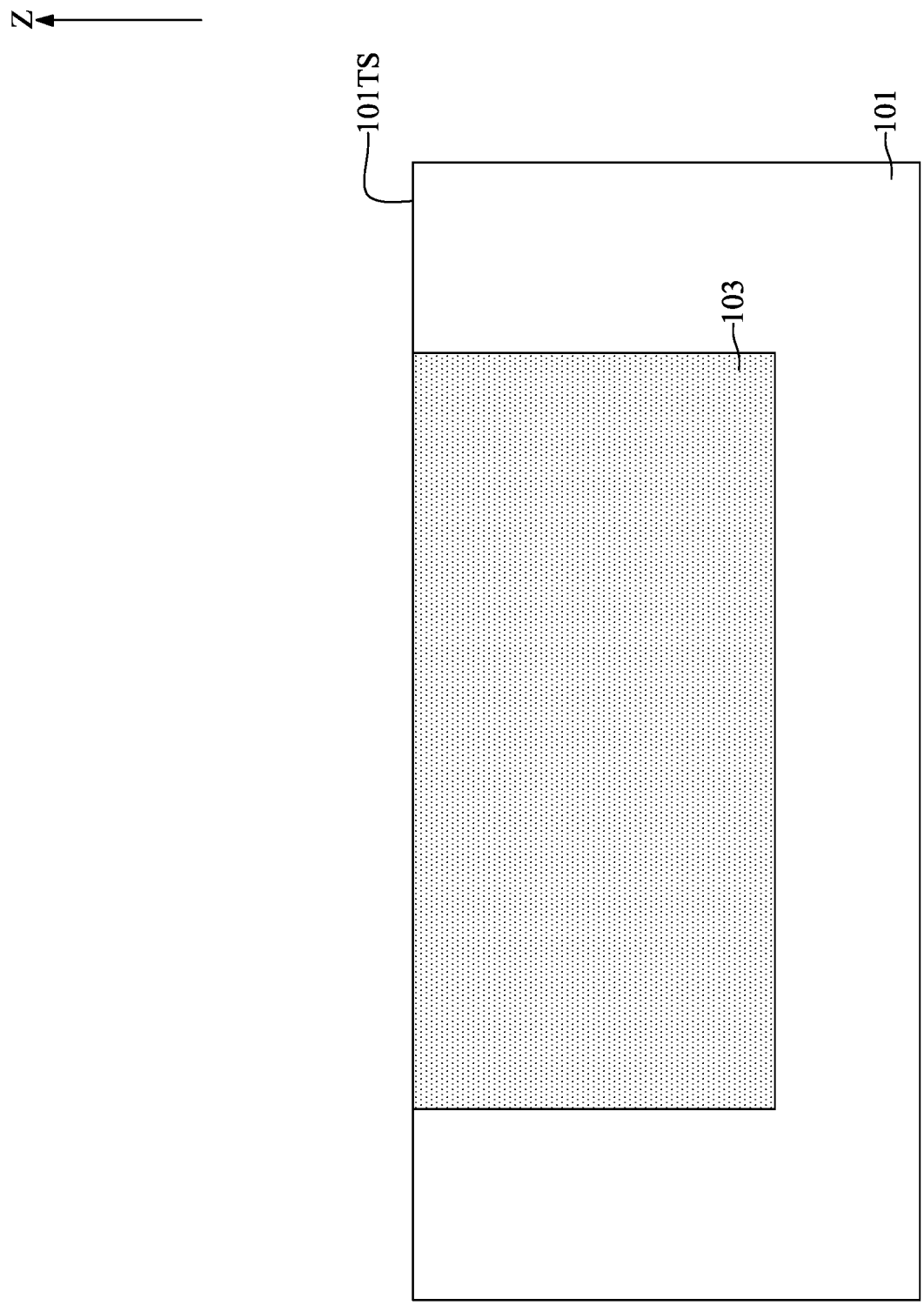
FIGS. 22 to 24 illustrate, in schematic cross-sectional view diagrams, part a flow for fabricating a semiconductor device in accordance with another embodiment of the present disclosure.
Figure 23:
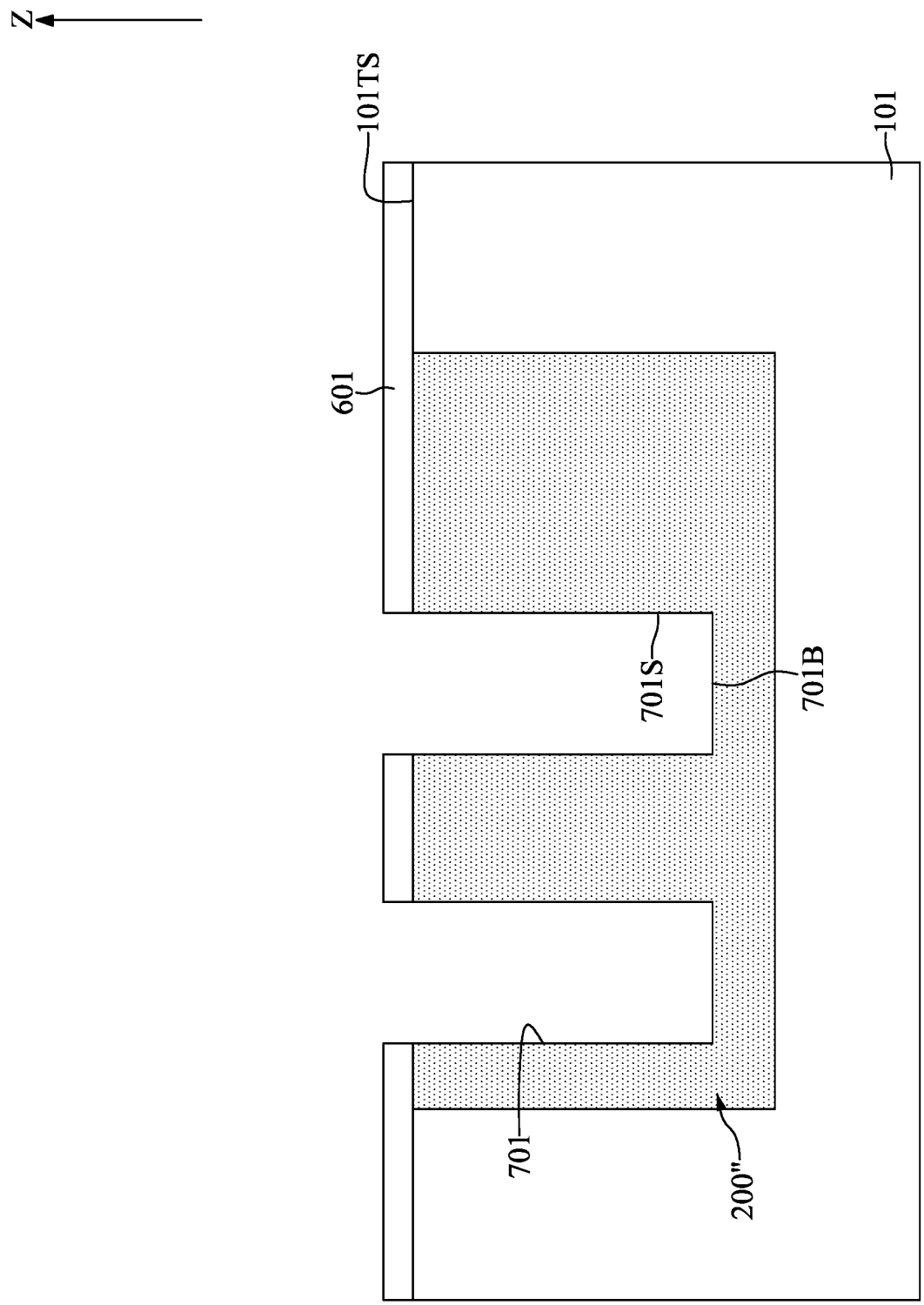
Figure 24:
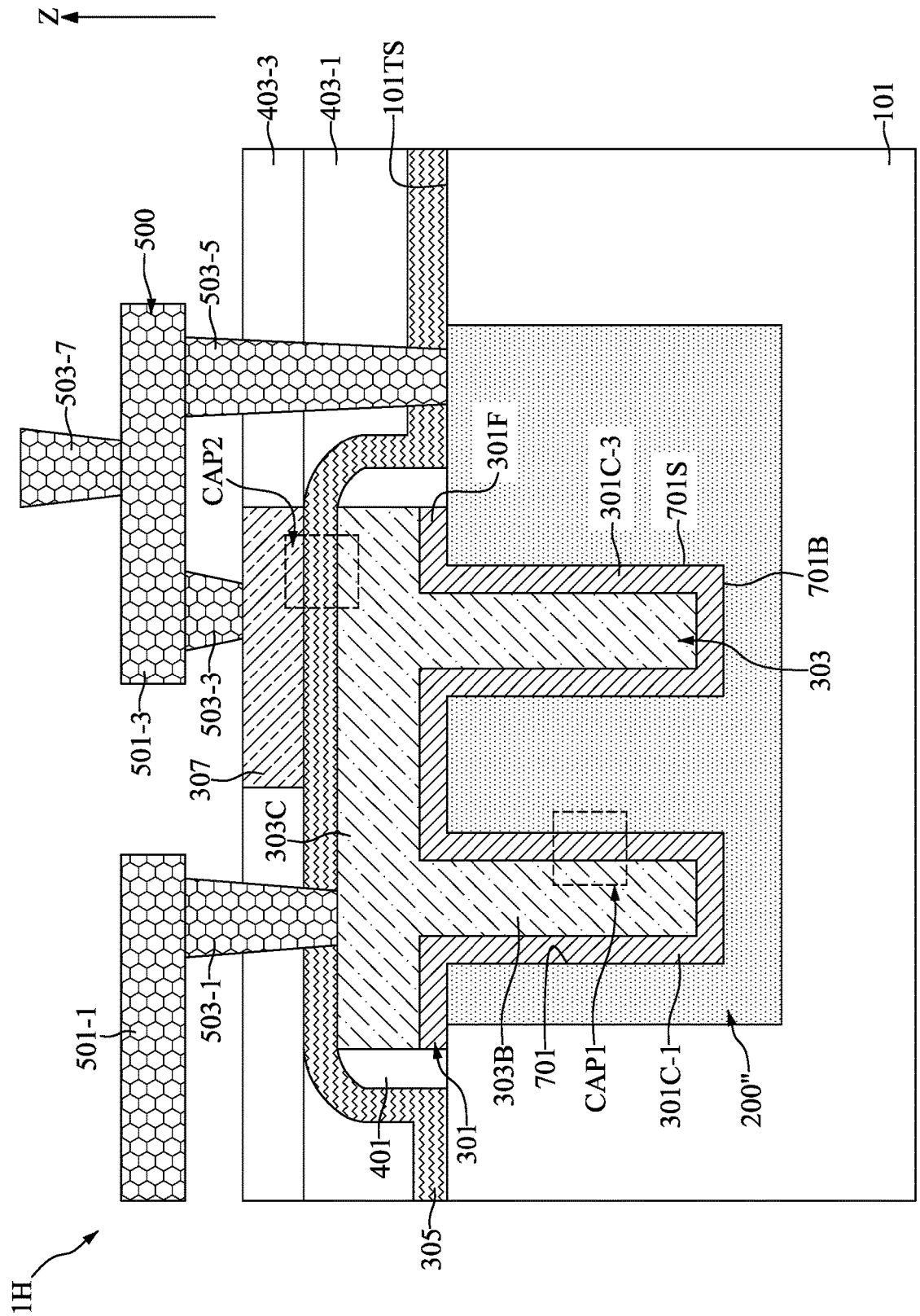

FIGS. 22 to 24 illustrate, in schematic cross-sectional view diagrams, part a flow for fabricating a semiconductor device 1H in accordance with another embodiment of the present disclosure.

With reference to FIG. 22, an impurity region 103 may be formed in the substrate 101. In some embodiments, the impurity region 103 may be formed by providing a mask (not shown) over the substrate 101 and directing a beam of ions toward the masked substrate 101. The mask may block ions or diffusion species from entering the substrate 101, whereas ions or diffusion species pass through an opening in the mask to form the impurity region 103. In some embodiments, the impurity region 103 may be formed using a phosphorous oxychloride doping method or some other doping method, rather than ion implantation. The impurity region 103 may have the second electrical type opposite to the first electrical type of the substrate 101. In some embodiments, the dopant concentration of the impurity region 103 may be between about 1E19 atoms/cm$^3$ and about 1E21 atoms/cm$^3$.

With reference to FIG. 23, the first hard mask layer 601 may be formed on the substrate 101 and may have the pattern of the first trenches 701. An etch process, such as an anisotropic dry etch process, may be performed to remove portions of the substrate 101 and concurrently form the first trenches 701. After the etch process, the impurity region 103 may be turned into a bottom conductive structure 200''. The bottom conductive structure 200'' may surround the first trenches 701.

With reference to FIG. 24, the first insulating layer 301, the shared conductive layer 303, the second insulating layer 305, the top conductive layer 307, the inter-layer dielectrics 403-1, 403-3, and the connection structure 500 may be formed with a procedure similar to that illustrated in FIGS. 5 to 12.

With reference to FIG. 24, the bottom conductive structure 200'', the first insulating layer 301, and the shared conductive layer 303 together configure the first capacitor unit CAP1. The shared conductive layer 303, the second insulating layer 305, and the top conductive layer 307 together configure the second capacitor unit CAP2. The first capacitor unit CAP1 and the second capacitor unit CAP2 may be electrical parallel by the connection structure 500.

FIGS. 25 to 29 illustrate, in schematic cross-sectional view diagrams, part a flow for fabricating a semiconductor device 1I in accordance with another embodiment of the present disclosure.

Figure 25:
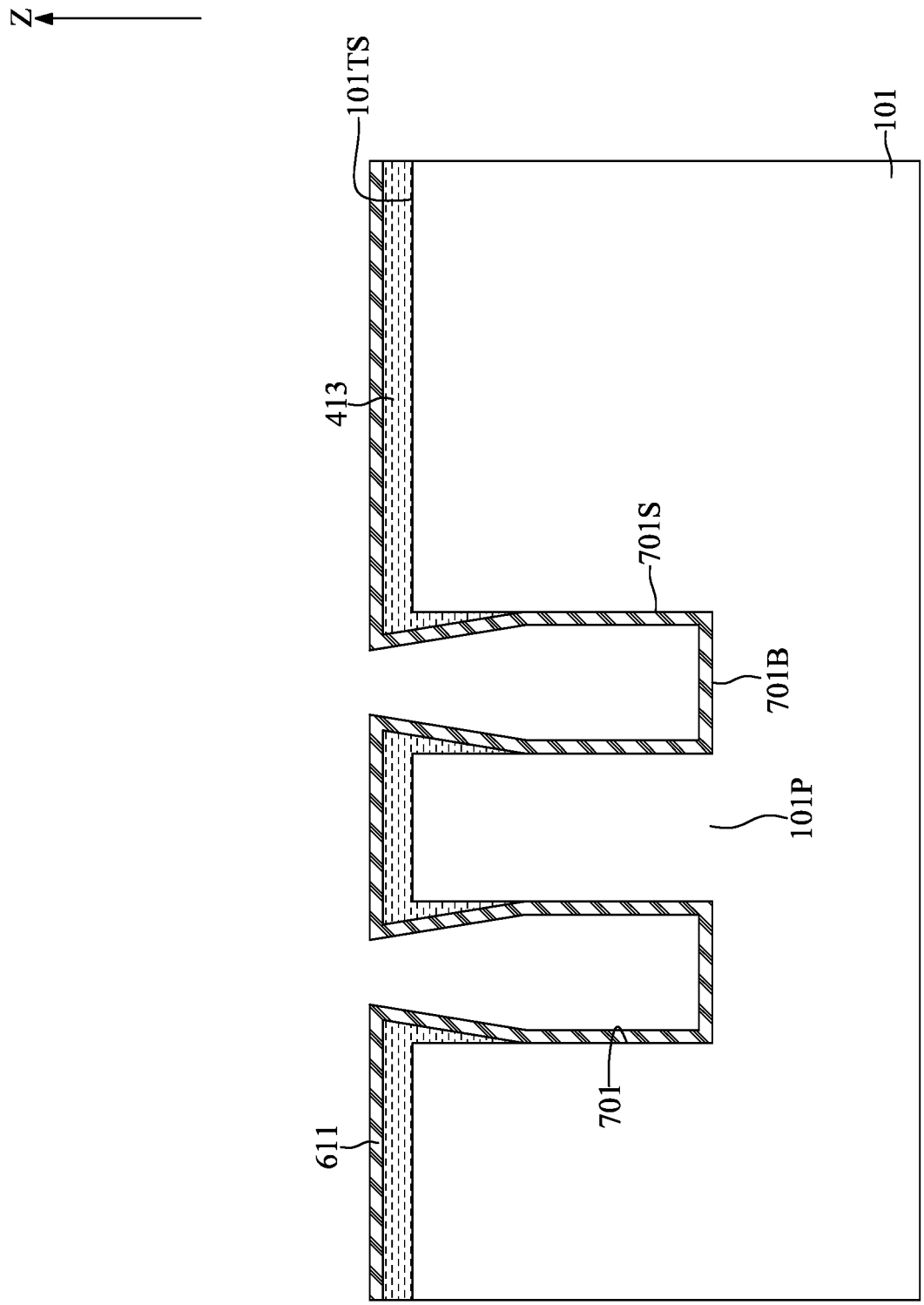
FIGS. 25 to 29 illustrate, in schematic cross-sectional view diagrams, part a flow for fabricating a semiconductor device in accordance with another embodiment of the present disclosure.

With reference to FIG. 25, the substrate 101 and the first trenches 701 may be formed with a procedure similar to that illustrated in FIG. 2. A covering layers 413 may be formed to cover the top surface 101TS of the substrate 101 and upper portions of the first trenches 701. In some embodiments, the covering layers 413 may be formed to cover the top surface 101TS of the substrate 101 and upper portions of the sidewalls 701S of the first trenches 701.

In some embodiments, the covering layers 413 may be formed of, for example, aluminum oxide, hafnium oxide, zirconium oxide, titanium oxide, titanium nitride, tungsten nitride, silicon nitride, or silicon oxide. The covering layers 413 may be formed by a deposition process such as an atomic layer deposition method precisely controlling an amount of a first precursor of the atomic layer deposition method.

In some embodiments, when the covering layers 413 are formed of aluminum oxide, the first precursor of the atomic layer deposition method may be trimethylaluminum and a second precursor of the atomic layer deposition method may be water or ozone.

In some embodiments, when the covering layers 413 are formed of hafnium oxide, the first precursor of the atomic layer deposition method may be hafnium tetrachloride, hafnium tert-butoxide, hafnium dimethylamide, hafnium ethylmethylamide, hafnium diethylamide, or hafnium methoxy-t-butoxide and the second precursor of the atomic layer deposition method may be water or ozone.

In some embodiments, when the covering layers 413 are formed of zirconium oxide, the first precursor of the atomic layer deposition method may be zirconium tetrachloride and the second precursor of the atomic layer deposition method may be water or ozone.

In some embodiments, when the covering layers 413 are formed of titanium oxide, the first precursor of the atomic layer deposition method may be titanium tetrachloride, tetraethyl titanate, or titanium isopropoxide and the second precursor of the atomic layer deposition method may be water or ozone.

In some embodiments, when the covering layers 413 are formed of titanium nitride, the first precursor of the atomic layer deposition method may be titanium tetrachloride and ammonia.

In some embodiments, when the covering layers 413 are formed of tungsten nitride, the first precursor of the atomic layer deposition method may be tungsten hexafluoride and ammonia.

In some embodiments, when the covering layers 413 are formed of silicon nitride, the first precursor of the atomic layer deposition method may be silylene, chlorine, ammonia, and/or dinitrogen tetrahydride.

In some embodiments, when the covering layers 413 are formed of silicon oxide, the first precursor of the atomic layer deposition method may be silicon tetraisocyanate or $CH_3OSi(NCO)_3$ and the second precursor of the atomic layer deposition method may be hydrogen or ozone.

With reference to FIG. 25, a dopant source liner 611 may be conformally formed to cover the covering layers 413 and the lower portions of the first trenches 701. The dopant source liner 611 may be formed of, for example, arsenic silicate glass and may serve as a dopant source for forming bottom conductive structure 200''' as will be illustrated later.

Figure 26:
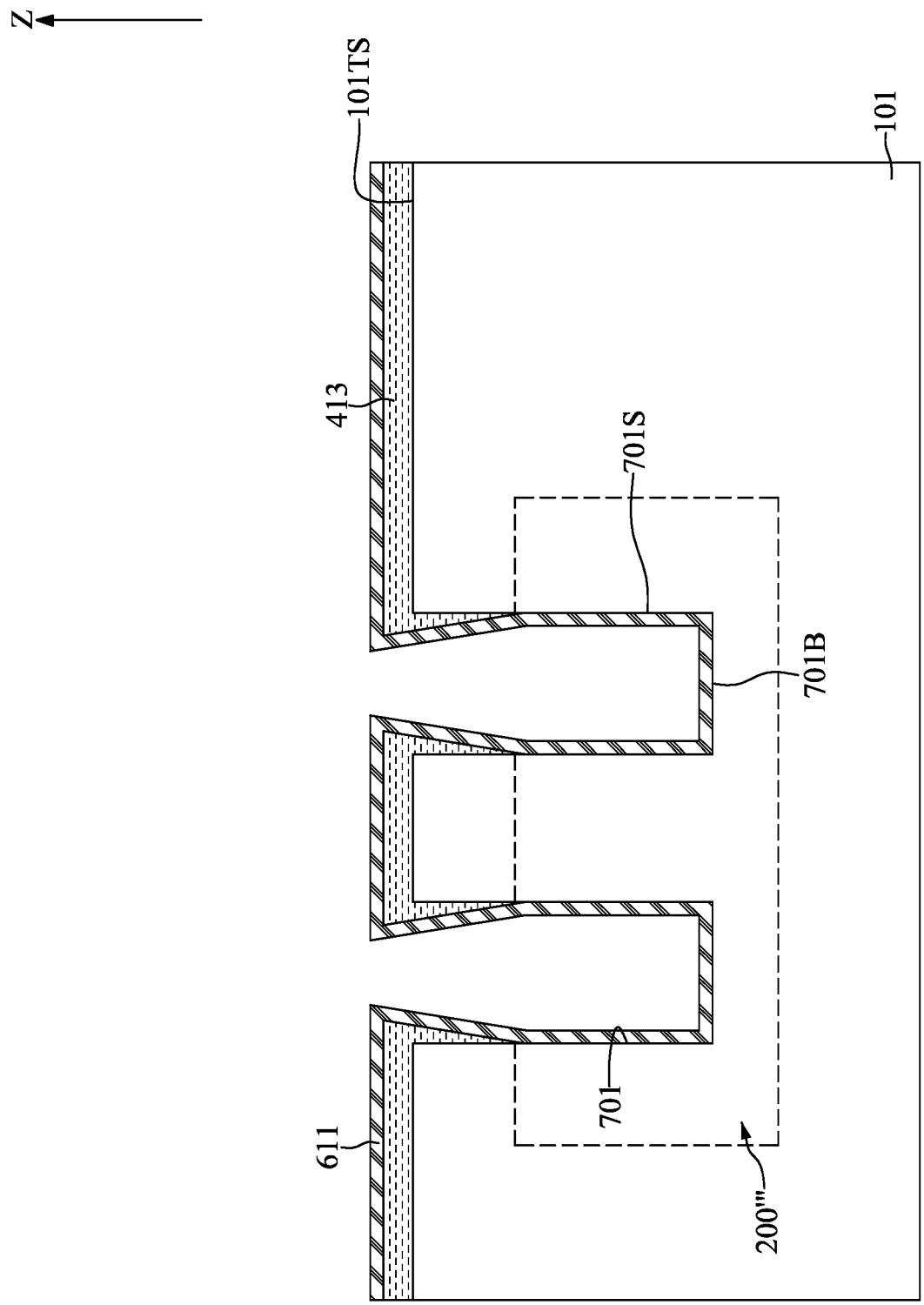

With reference to FIG. 26, an annealing process may be performed to diffuse out the dopant source liner 611 and form the bottom conductive structure 200''' in regions surrounding the lower portions of the first trenches 701.

Figure 27:
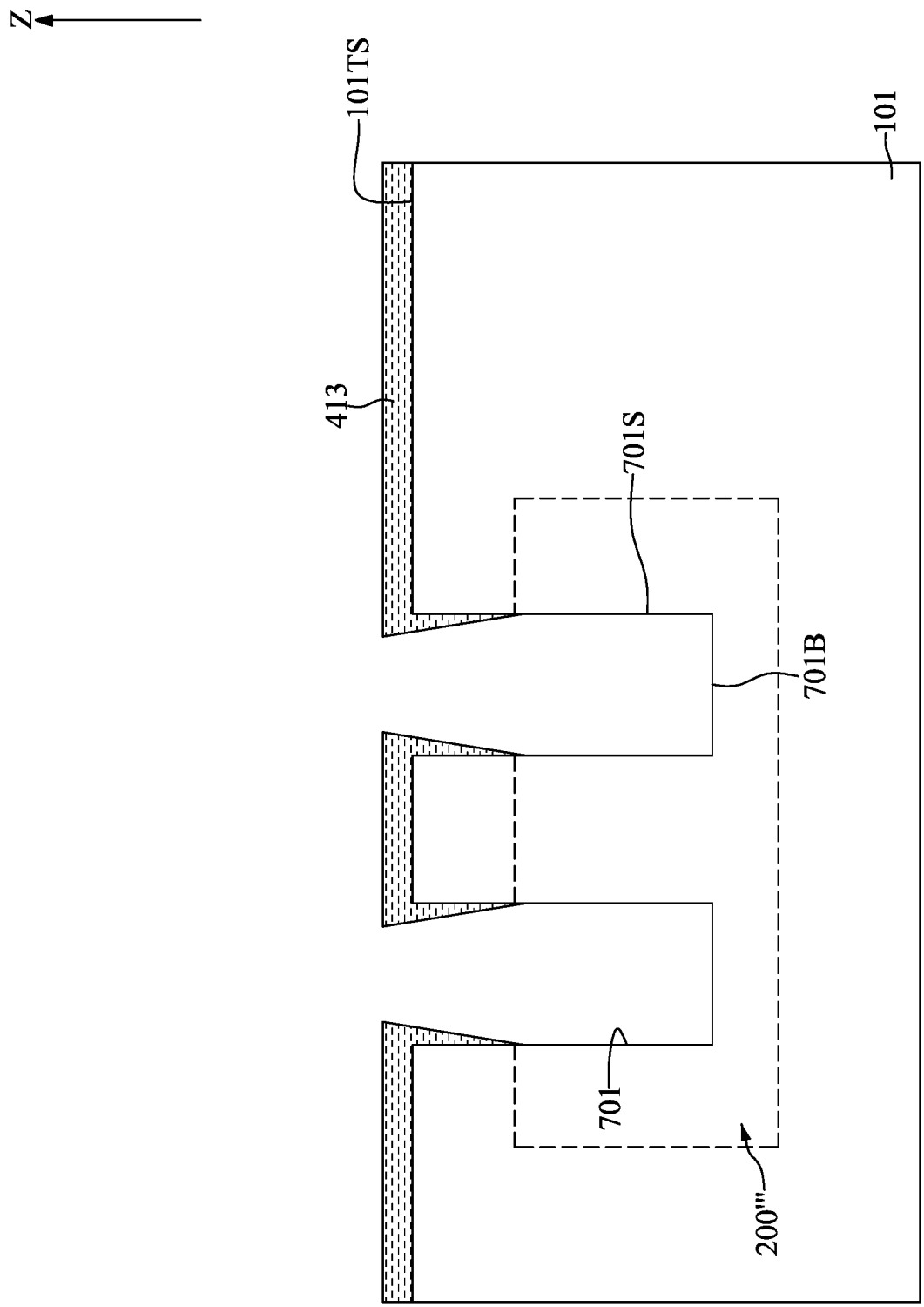

With reference to FIG. 27, a wet etch process may be performed to remove the dopant source liner 611. The etch rate ratio of the dopant source liner 611 to the covering layers 413 may be between about between about 15:1 and about 2:1 or between about 10:1 and about 2:1 during the wet etch process. The etch rate ratio of the dopant source liner 611 to the substrate 101 may be between about between about 15:1 and about 2:1 or between about 10:1 and about 2:1 during the wet etch process.

Figure 28:
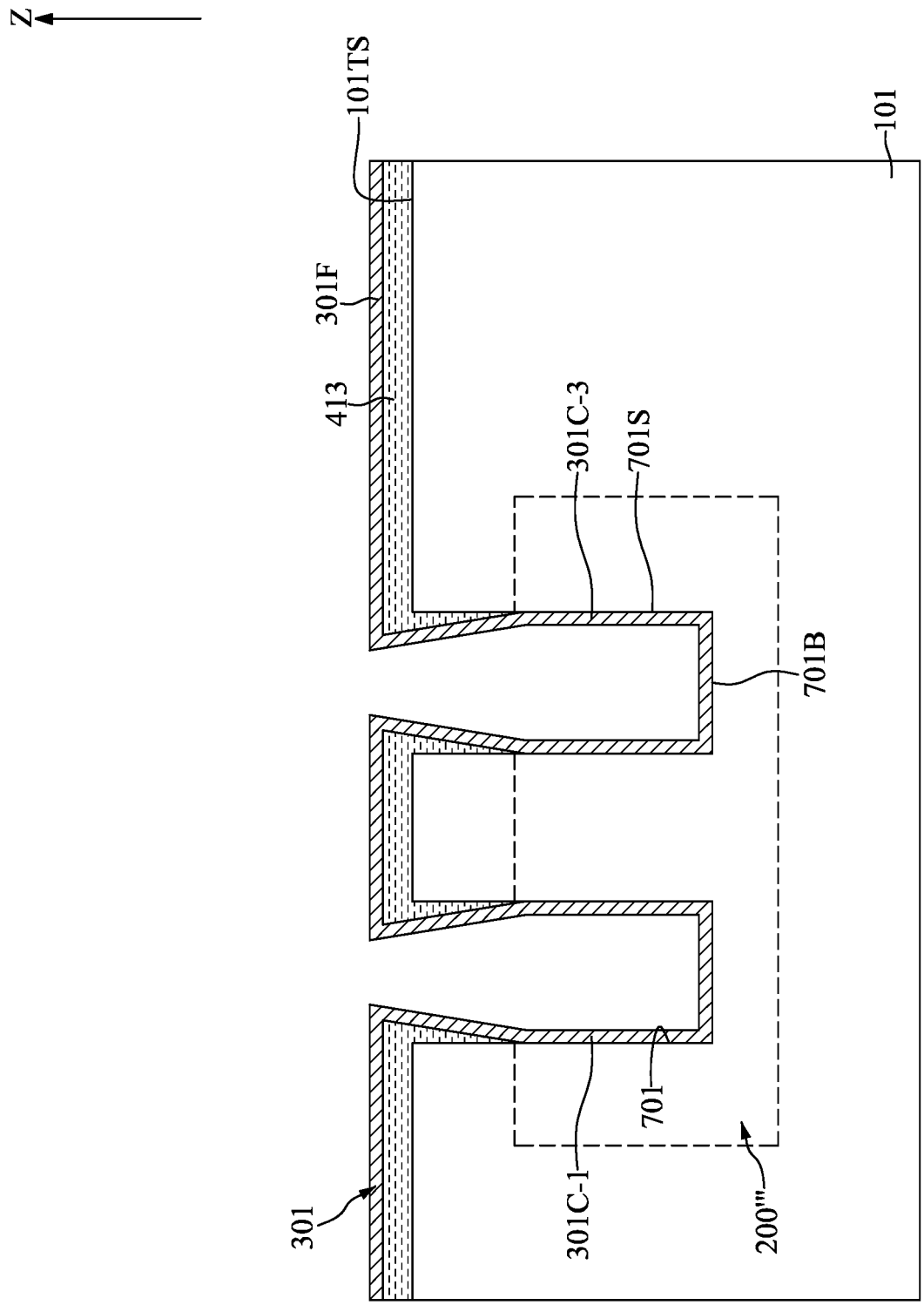

With reference to FIG. 28, the first insulating layer 301 may be conformally formed to cover the covering layers 413, the lower portions of the sidewalls 701S of the first trenches 701, and the bottom surfaces 701B of the first trenches 701.

Figure 29:
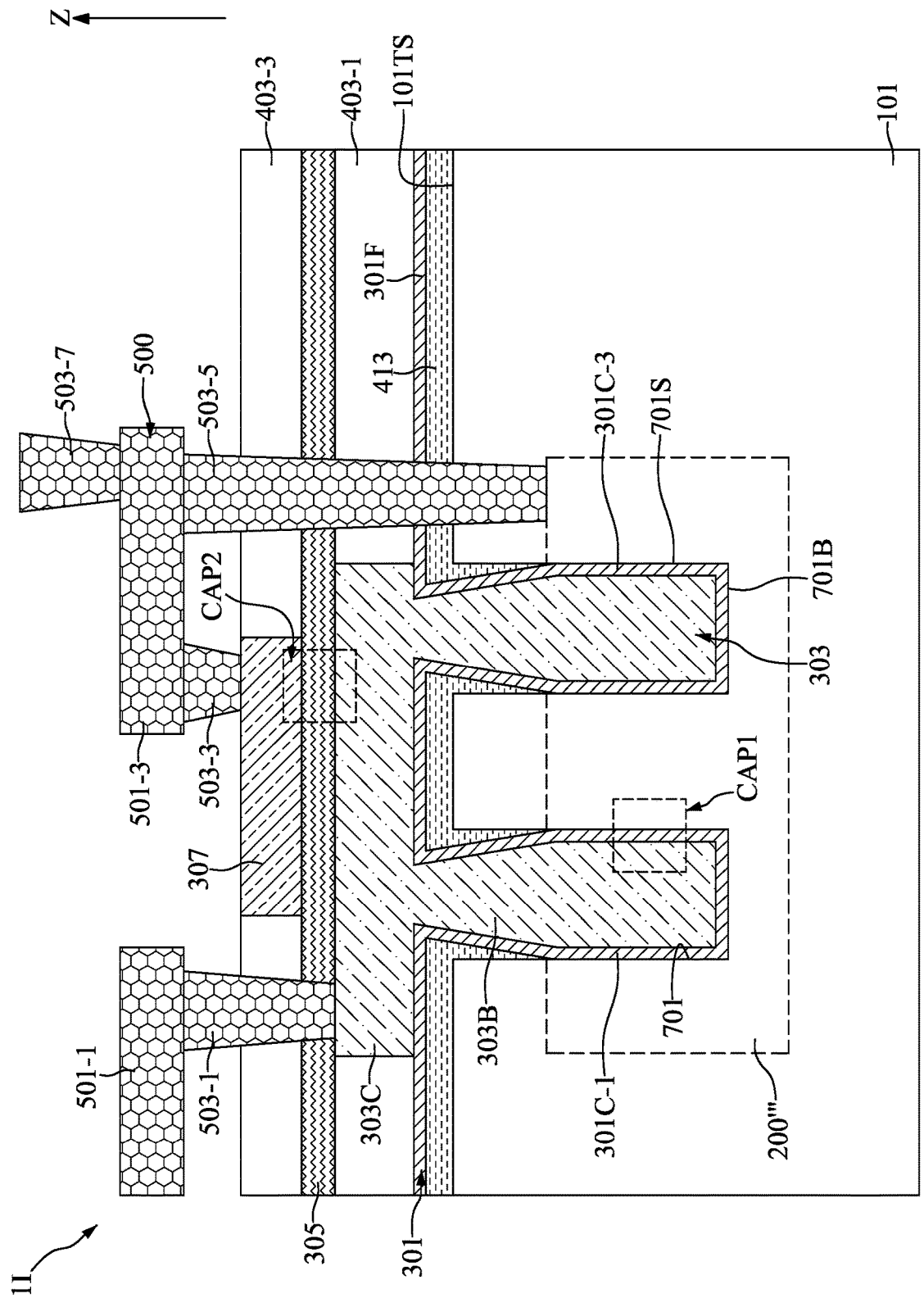

With reference to FIG. 29, the shared conductive layer 303 may be formed to fill the first trenches 701 and on the first insulating layer 301. During the deposition of the shared conductive layer 303, the covering layers 413 may reduce the deposition rate on the sidewalls 701S of the first trenches 701 relative to the deposition rate on the bottom surfaces 701B of the first trenches 701 such that the first trenches 701 may be filled without any void formation near the bottom surfaces 701B of the first trenches 701. The second insulating layer 305, the top conductive layer 307, the inter-layer dielectrics 403-1, 403-3, and the connection structure 500 may be formed with a procedure similar to that illustrated in FIGS. 14 and 15.

With reference to FIG. 29, the bottom conductive structure 200''', the first insulating layer 301, and the shared conductive layer 303 together configure the first capacitor unit CAP1. The shared conductive layer 303, the second insulating layer 305, and the top conductive layer 307 together configure the second capacitor unit CAP2. The first capacitor unit CAP1 and the second capacitor unit CAP2 may be electrical parallel by the connection structure 500.

FIGS. 30 to 33 illustrate, in schematic cross-sectional view diagrams, part a flow for fabricating a semiconductor device 1J in accordance with another embodiment of the present disclosure.

Figure 30:
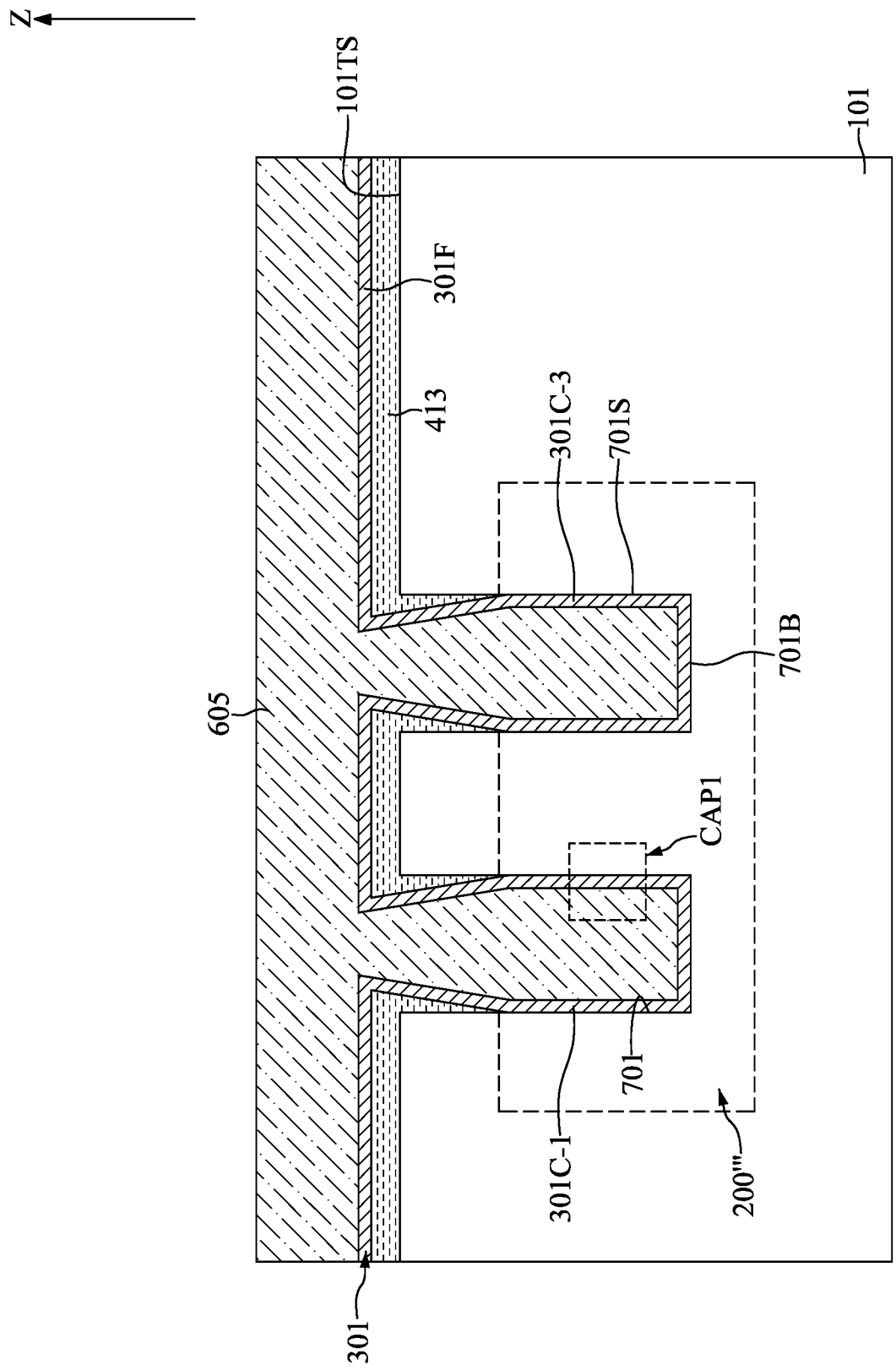
FIGS. 30 to 33 illustrate, in schematic cross-sectional view diagrams, part a flow for fabricating a semiconductor device in accordance with another embodiment of the present disclosure.

With reference to FIG. 30, an intermediate semiconductor device may be fabricating with a procedure similar to that illustrated in FIGS. 25 to 28. The layer of first conductive material 605 may be formed to fill the first trenches 701 and cover the first insulating layer 301.

Figure 31:
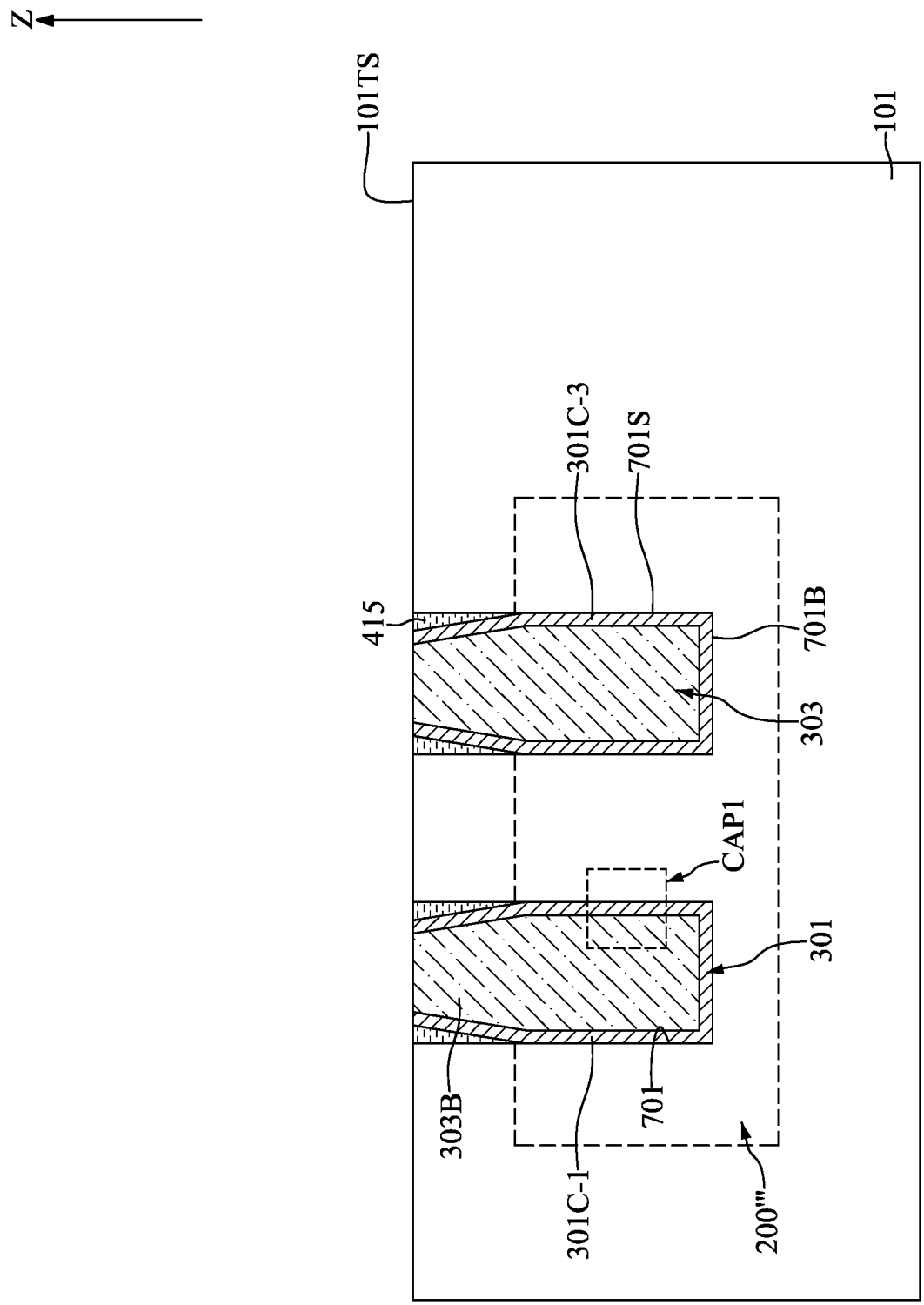

With reference to FIG. 31, a planarization process, such as chemical mechanical polishing, may be performed until the top surface 101TS of the substrate 101 is exposed to remove excess material and provide a substantially flat surface for subsequent processing steps. After the planarization, the covering layers 413 may be turned into collar insulating layers 415. The layer of first conductive material 605 may be turned into bottom portions 303B in the first trenches 701.

Figure 32:
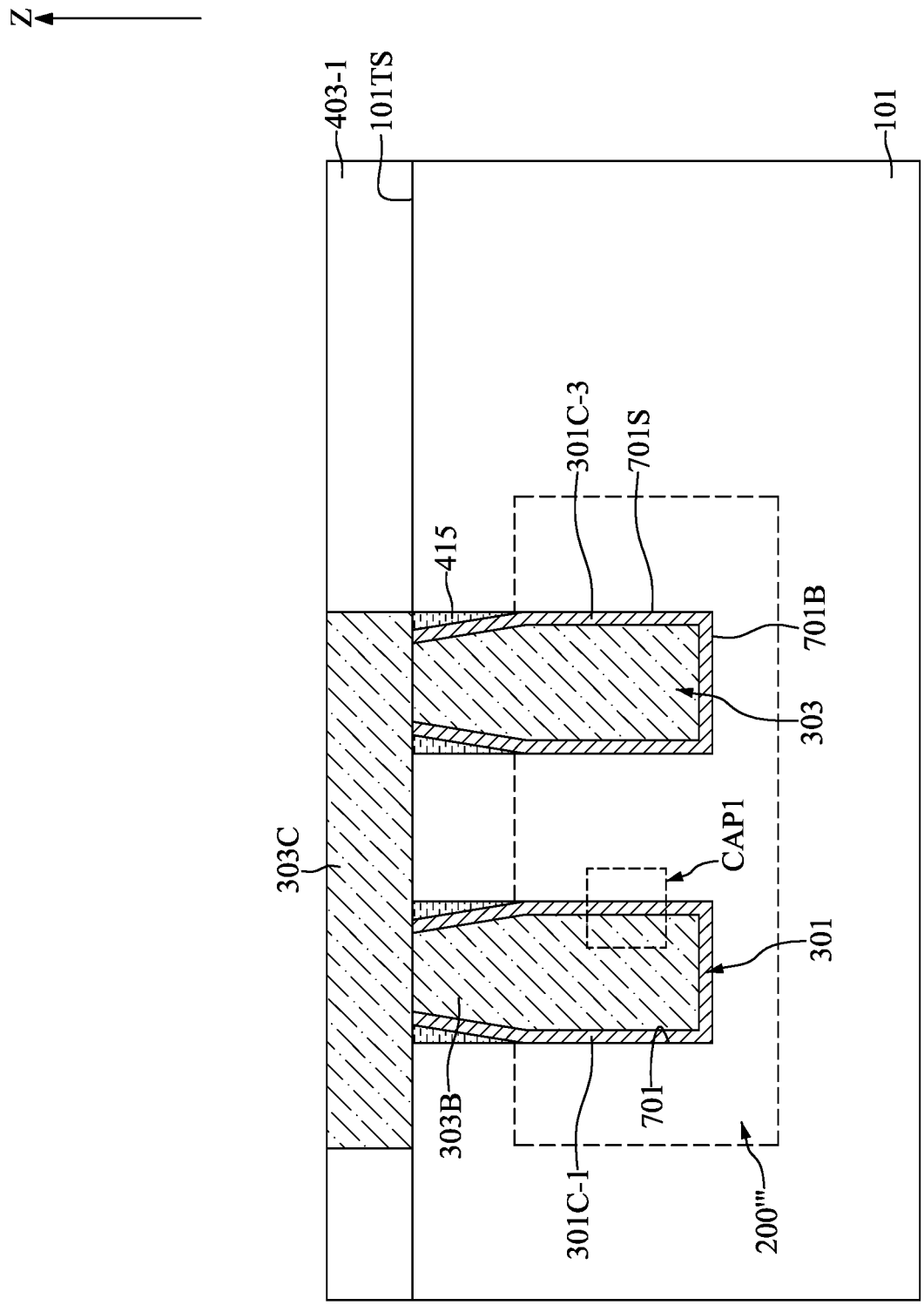

With reference to FIG. 32, the inter-layer dielectric 403-1 may be formed on the substrate 101 and a connection portion 303C may be formed in the inter-layer dielectric 403-1 by a damascene process. The connection portion 303C and the bottom portions 303B may together form a shared conductive layer 303. The bottom conductive structure 200''', the first insulating layer 301, and the shared conductive layer 303 together configure the first capacitor unit CAP1.

Figure 33:
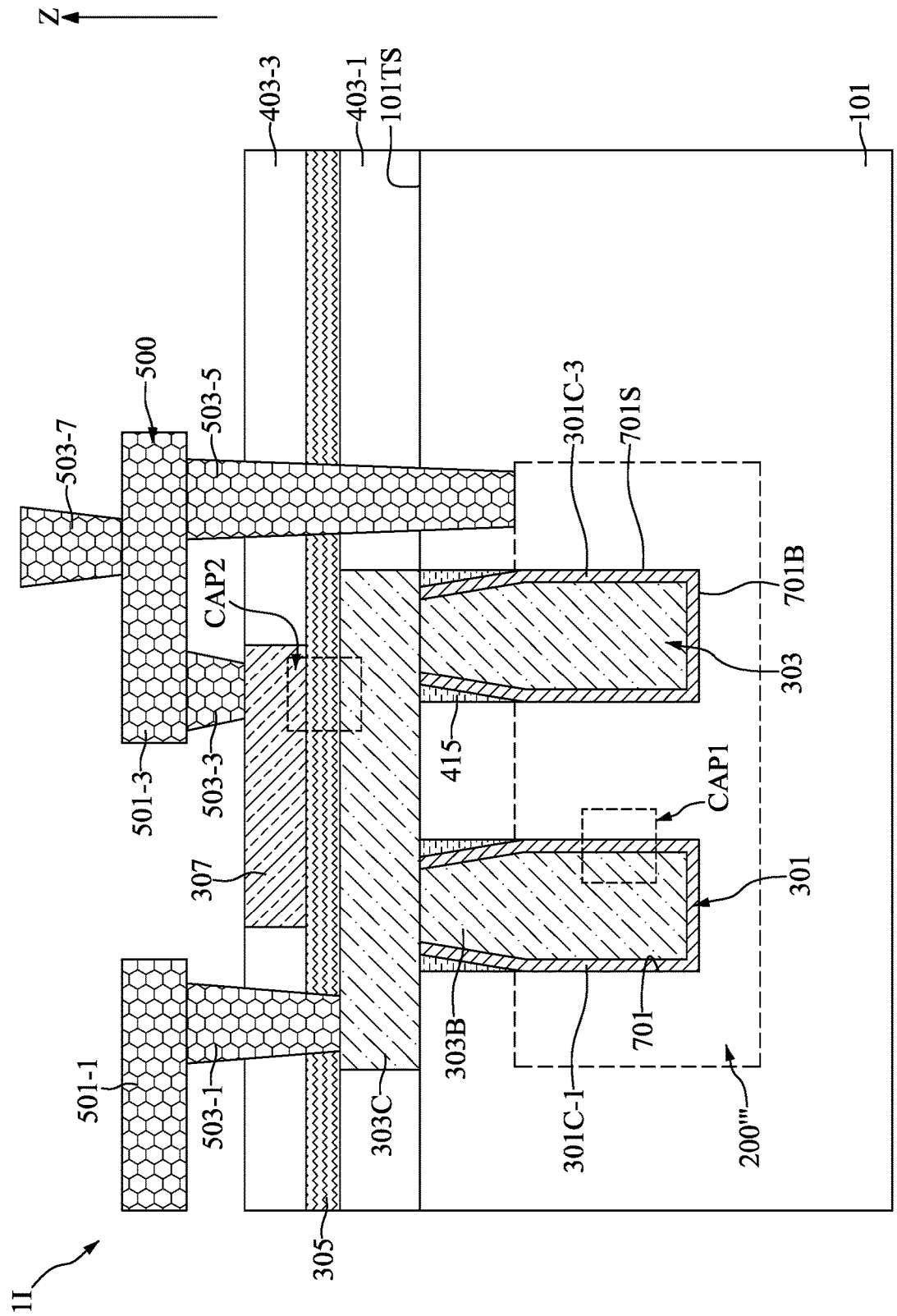

With reference to FIG. 33, the second insulating layer 305, the top conductive layer 307, the inter-layer dielectric 403-3, and the connection structure 500 may be formed with a procedure similar to that illustrated in FIG. 15. The shared conductive layer 303, the second insulating layer 305, and the top conductive layer 307 together configure the second capacitor unit CAP2. The first capacitor unit CAP1 and the second capacitor unit CAP2 may be electrical parallel by the connection structure 500.

One aspect of the present disclosure provides a semiconductor device including a substrate, a first capacitor unit, a second capacitor unit, and a connection structure. The first capacitor unit includes a bottom conductive structure inwardly positioned in the substrate, and a shared conductive layer positioned above the bottom conductive structure with a first insulating layer interposed therebetween. The second capacitor unit includes the shared conductive layer, a top conductive layer positioned above the shared conductive layer with a second insulating layer interposed therebetween. The connection structure electrically connects the bottom conductive structure and the top conductive layer such that the first capacitor unit and the second capacitor unit are in parallel.

Another aspect of the present disclosure provides a method for fabricating a semiconductor device including providing a substrate, forming a first trench in the substrate, doping sidewalls and a bottom surface of the first trench to form a bottom conductive structure, forming a first insulating layer on the bottom conductive structure and in the first trench, forming a shared conductive layer on the first insulating layer, forming a second insulating layer on the shared conductive layer, forming a top conductive layer on the second insulating layer, and forming a connection structure electrically connecting the bottom conductive structure and the top conductive layer. The bottom conductive structure, the first insulating layer, and the shared conductive layer together configure a first capacitor unit. The shared conductive layer, the second insulating layer, and the top conductive layer together configure a second capacitor unit.

Due to the design of the semiconductor device of the present disclosure, the capacitance density may be increased by the stacked and electrically paralleled coupled first capacitor unit CAP1 and second capacitor unit CAP2. Accordingly, the effective capacitance of the semiconductor device 1A may be increased such that the performance of the semiconductor device 1A may be improved.

It should be noted that the terms "forming," "formed" and "form" may mean and include any method of creating, building, patterning, implanting, or depositing an element, a dopant or a material. Examples of forming methods may include, but are not limited to, atomic layer deposition, chemical vapor deposition, physical vapor deposition, sputtering, co-sputtering, spin coating, diffusing, depositing, growing, implantation, photolithography, dry etching and wet etching.

It should be noted that the functions or steps noted herein may occur in an order different from the order noted in the figures. For example, two figures shown in succession may in fact be executed substantially concurrently or may sometimes be executed in a reversed order, depending upon the functionalities or steps involved.

It should be noted that, the term "about" modifying the quantity of an ingredient, component, or reactant of the present disclosure refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value.

In yet another aspect, the term "about" means within 10, 9, 8, 7, 6, 5, 4, 3, 2, or 1% of the reported numerical value.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A method for fabricating a semiconductor device, comprising:
   providing a substrate;
   forming a first trench in the substrate;
   doping sidewalls and a bottom surface of the first trench to form a bottom conductive structure;
   forming a first insulating layer on the bottom conductive structure and in the first trench;
   forming first spacers on sidewalls of the shared conductive layer;
   forming a shared conductive layer on the first insulating layer and the first spacers after forming the first spacers;
   forming a second insulating layer on the shared conductive layer;
   forming a top conductive layer on the second insulating layer; and
   forming a connection structure electrically connecting the bottom conductive structure and the top conductive layer;
   wherein the bottom conductive structure, the first insulating layer, and the shared conductive layer together configure a first capacitor unit, and the shared conductive layer, the second insulating layer, and the top conductive layer together configure a second capacitor unit.

2. The method for fabricating the semiconductor device of claim 1, wherein the substrate and the bottom conductive structure have opposite electrical type.

3. The method for fabricating the semiconductor device of claim 2, wherein an aspect ratio of the first trench is between about 1:6 and about 1:20.

4. The method for fabricating the semiconductor device of claim 3, wherein the first insulating layer is formed of an insulating material having a dielectric constant of about 4.0 or greater.

5. The method of claim 1, wherein a width of the second insulating layer is greater than a width of the shared conductive layer.

6. The method of claim 5, wherein the connection structure comprising a first conductive via electrically connecting the top conductive layer, a second conductive via electrically connecting the bottom conductive structure, and a conductive line horizontally on the first conductive via and the second conductive via and electrically connect the first conductive via and the second conductive via.

7. The method of claim 6, further comprising: forming an assistant conductive layer between the second conductive via and the bottom conductive structure, wherein the assistant conductive layer is formed of titanium silicide, nickel silicide, nickel platinum silicide, tantalum silicide, or cobalt silicide.

8. The method of claim 7, wherein a thickness of the assistant conductive layer is between about 2 nm and about 20 nm.

9. The method of claim 1, wherein the first insulating layer is an oxide-nitride-oxide structure.

10. The method of claim 9, further comprising: forming an interfacial layer between the bottom conductive structure and the first insulating layer, wherein the interfacial layer is formed of silicon oxide.

11. The method of claim 10, wherein a thickness of the interfacial layer is between about 7 angstroms and about 12 angstroms.

12. The method of claim 9, further comprising: forming a first barrier layer between the first insulating layer and the shared conductive layer, wherein the first barrier layer is formed of titanium, titanium nitride, titanium silicon nitride, tantalum, tantalum nitride, tantalum silicon nitride, or a combination thereof.

13. The method of claim 12, wherein a thickness of the first barrier layer is between about 10 angstroms and about 15 angstroms.

14. The method of claim 9, wherein a thickness of the first insulating layer is about 10 angstroms and about 1000 angstroms.

15. The method of claim 5, wherein a width of the top conductive layer is less than the width of the shared conductive layer.

16. The method of claim 1, wherein the shared conductive layer comprises a connection portion above a top surface of the substrate and a bottom portion extending downwardly to the substrate.

* * * * *